(12) United States Patent
Jiang

(10) Patent No.: US 9,885,449 B2
(45) Date of Patent: Feb. 6, 2018

(54) LED TUBE LAMP

(71) Applicant: JIAXING SUPER LIGHTING ELECTRIC APPLIANCE CO.,LTD, Zhejiang (CN)

(72) Inventor: Tao Jiang, Zhejiang (CN)

(73) Assignee: JIAXING SUPER LIGHTING ELECTRIC APPLIANCE CO., LTD, Zhejiang (CN)

(*) Notice: Subject to any disclaimer, the term of this patent is extended or adjusted under 35 U.S.C. 154(b) by 11 days.

(21) Appl. No.: 15/211,783

(22) Filed: Jul. 15, 2016

(65) Prior Publication Data

US 2017/0089521 A1    Mar. 30, 2017

Related U.S. Application Data

(63) Continuation-in-part of application No. 15/087,088, filed on Mar. 31, 2016, which is a
(Continued)

(30) Foreign Application Priority Data

Sep. 28, 2014   (CN) .......................... 2014 1 0507660
Sep. 28, 2014   (CN) .......................... 2014 1 0508899
(Continued)

(51) Int. Cl.
H05B 41/16     (2006.01)
H05B 41/24     (2006.01)
(Continued)

(52) U.S. Cl.
CPC ................ *F21K 9/278* (2016.08); *F21K 9/27* (2016.08); *F21K 9/272* (2016.08); *F21V 29/508* (2015.01);
(Continued)

(58) Field of Classification Search
None
See application file for complete search history.

(56) References Cited

U.S. PATENT DOCUMENTS 3,294,518 A    12/1966   Laseck et al.
4,647,399 A    3/1987    Peters et al.
(Continued)

FOREIGN PATENT DOCUMENTS

CN    201363601    12/2009
CN    102052652    5/2011
(Continued)

*Primary Examiner* — Anh Tran
(74) *Attorney, Agent, or Firm* — Andrew M. Calderon; Roberts Mlotkowski Safran; Cole & Calderon, P.C.

(57) ABSTRACT

An LED tube lamp includes a tube, two end caps, a power supply, and an LED light strip. The tube includes two rear end regions, two transition regions, and a main body region. The end caps are respectively connected to the rear end regions. The power supply is in one or both of the end caps. The LED light strip including one or more LED light sources is in the tube. The LED light sources are electrically connected to the power supply via the LED light strip. The end cap includes a lateral wall, an end wall, and at least one opening for heat dissipation and/or pressure releasing. The at least one opening penetrates through the end cap with a light sensor inside the end cap collimating with the opening.

30 Claims, 21 Drawing Sheets

Related U.S. Application Data continuation-in-part of application No. 14/865,387, filed on Sep. 25, 2015, now Pat. No. 9,609,711.

(30) Foreign Application Priority Data

| Nov. 6, 2014 | (CN) | 2014 1 0623355 |
|---|---|---|
| Dec. 5, 2014 | (CN) | 2014 1 0734425 |
| Feb. 12, 2015 | (CN) | 2015 1 0075925 |
| Mar. 10, 2015 | (CN) | 2015 1 0104823 |
| Mar. 26, 2015 | (CN) | 2015 1 0133689 |
| Mar. 26, 2015 | (CN) | 2015 1 0134586 |
| Mar. 27, 2015 | (CN) | 2015 1 0136796 |
| Apr. 3, 2015 | (CN) | 2015 1 0155807 |
| Apr. 14, 2015 | (CN) | 2015 1 0173861 |
| Apr. 22, 2015 | (CN) | 2015 1 0193980 |
| May 19, 2015 | (CN) | 2015 1 0259151 |
| May 22, 2015 | (CN) | 2015 1 0268927 |
| May 29, 2015 | (CN) | 2015 1 0284720 |
| Jun. 10, 2015 | (CN) | 2015 1 0315636 |
| Jun. 17, 2015 | (CN) | 2015 1 0338027 |
| Jun. 26, 2015 | (CN) | 2015 1 0364735 |
| Jun. 26, 2015 | (CN) | 2015 1 0372375 |
| Jun. 26, 2015 | (CN) | 2015 1 0373492 |
| Jun. 29, 2015 | (CN) | 2015 1 0378322 |
| Jul. 2, 2015 | (CN) | 2015 1 0391910 |
| Jul. 10, 2015 | (CN) | 2015 1 0406595 |
| Jul. 20, 2015 | (CN) | 2015 1 0428680 |
| Aug. 8, 2015 | (CN) | 2015 1 0483475 |
| Aug. 8, 2015 | (CN) | 2015 1 0486115 |
| Aug. 19, 2015 | (CN) | 2015 1 0482944 |
| Sep. 2, 2015 | (CN) | 2015 1 0555543 |
| Sep. 6, 2015 | (CN) | 2015 1 0557717 |
| Sep. 18, 2015 | (CN) | 2015 1 0595173 |
| Nov. 27, 2015 | (CN) | 2015 1 0848766 |
| Jan. 22, 2016 | (CN) | 2016 1 0044148 |
| Mar. 25, 2016 | (CN) | 2016 1 0177706 |
| May 18, 2016 | (CN) | 2016 1 0327806 |

(51) Int. Cl.

| F21K 9/278 | (2016.01) |
|---|---|
| F21K 9/272 | (2016.01) |
| F21V 29/89 | (2015.01) |
| F21V 29/508 | (2015.01) |
| H05B 33/08 | (2006.01) |
| F21V 29/83 | (2015.01) |
| F21K 9/27 | (2016.01) |
| H05K 3/36 | (2006.01) |
| F21Y 115/10 | (2016.01) |
| F21Y 103/10 | (2016.01) |
| F21V 3/02 | (2006.01) |
| F21V 17/10 | (2006.01) |
| F21V 23/02 | (2006.01) |
| H05K 1/11 | (2006.01) |
| H05K 1/18 | (2006.01) |
| F21K 9/66 | (2016.01) |

(52) U.S. Cl.
CPC ............. *F21V 29/83* (2015.01); *F21V 29/89* (2015.01); *H05B 33/0809* (2013.01); *H05K 3/363* (2013.01); *F21K 9/66* (2016.08); *F21V 3/02* (2013.01); *F21V 17/101* (2013.01); *F21V 23/02* (2013.01); *F21Y 2103/10* (2016.08); *F21Y 2115/10* (2016.08); *H05K 1/118* (2013.01); *H05K 1/189* (2013.01); *H05K 2201/10106* (2013.01)

(56) References Cited

U.S. PATENT DOCUMENTS

| 5,575,459 A | 11/1996 | Anderson |
|---|---|---|
| 5,921,660 A | 7/1999 | Yu |
| 6,118,072 A | 9/2000 | Scott |
| 6,127,783 A | 10/2000 | Pashley et al. |
| 6,186,649 B1 | 2/2001 | Zou et al. |
| 6,211,262 B1 | 4/2001 | Mejiritski et al. |
| 6,609,813 B1 | 8/2003 | Showers et al. |
| 6,796,680 B1 | 9/2004 | Showers et al. |
| 6,936,855 B1 | 8/2005 | Harrah et al. |
| 7,033,239 B2 | 4/2006 | Cunkelman et al. |
| 7,067,032 B1 | 6/2006 | Bremont et al. |
| 8,360,599 B2 | 1/2013 | Ivey et al. |
| 8,579,463 B2 | 11/2013 | Clough |
| 2002/0044456 A1 | 4/2002 | Balestriero et al. |
| 2003/0231485 A1 | 12/2003 | Chien |
| 2004/0095078 A1 | 5/2004 | Leong |
| 2004/0189218 A1 | 9/2004 | Leong et al. |
| 2005/0128751 A1 | 6/2005 | Roberge et al. |
| 2005/0162850 A1 | 7/2005 | Luk et al. |
| 2005/0207166 A1 | 9/2005 | Kan et al. |
| 2005/0213321 A1 | 9/2005 | Lin |
| 2006/0028837 A1 | 2/2006 | Mrakovich et al. |
| 2007/0001709 A1 | 1/2007 | Shen |
| 2007/0145915 A1 | 6/2007 | Roberge et al. |
| 2007/0210687 A1 | 9/2007 | Axelsson |
| 2007/0274084 A1 | 11/2007 | Kan et al. |
| 2008/0030981 A1 | 2/2008 | Mrakovich et al. |
| 2008/0192476 A1 | 8/2008 | Hiratsuka |
| 2008/0278941 A1 | 11/2008 | Logan et al. |
| 2008/0290814 A1* | 11/2008 | Leong ...................... F21K 9/00 315/294 |
| 2009/0161359 A1 | 6/2009 | Siemiet et al. |
| 2010/0220469 A1 | 9/2010 | Ivey et al. |
| 2010/0253226 A1* | 10/2010 | Oki ........................... F21V 3/00 315/113 |
| 2010/0277918 A1* | 11/2010 | Chen ...................... F21V 23/00 362/249.02 |
| 2011/0038146 A1* | 2/2011 | Chen ..................... F21V 19/001 362/225 |
| 2011/0057572 A1 | 3/2011 | Kit et al. |
| 2011/0084608 A1 | 4/2011 | Lin et al. |
| 2011/0090684 A1 | 4/2011 | Logan et al. |
| 2011/0216538 A1 | 9/2011 | Logan et al. |
| 2011/0279063 A1 | 11/2011 | Wang et al. |
| 2012/0069556 A1 | 3/2012 | Bertram et al. |
| 2012/0106157 A1 | 5/2012 | Simon et al. |
| 2012/0146503 A1 | 6/2012 | Negley et al. |
| 2012/0153873 A1 | 6/2012 | Hayashi et al. |
| 2012/0169968 A1 | 7/2012 | Ishimori et al. |
| 2012/0212951 A1* | 8/2012 | Lai ........................ F21V 23/002 362/218 |
| 2012/0293991 A1 | 11/2012 | Lin |
| 2012/0319150 A1 | 12/2012 | Shimomura et al. |
| 2013/0033888 A1 | 2/2013 | Wel et al. |
| 2013/0050998 A1* | 2/2013 | Chu ........................ F21V 7/0008 362/218 |
| 2013/0051008 A1* | 2/2013 | Shew ...................... H02J 9/065 362/235 |
| 2013/0170245 A1 | 7/2013 | Hong et al. |
| 2013/0182425 A1 | 7/2013 | Seki et al. |
| 2013/0256704 A1 | 10/2013 | Hsiao et al. |
| 2013/0293098 A1 | 11/2013 | Li et al. |
| 2014/0009923 A1* | 1/2014 | Wu ........................... F21K 9/27 362/218 |
| 2014/0071667 A1 | 3/2014 | Hayashi et al. |
| 2014/0153231 A1 | 6/2014 | Bittmann |
| 2014/0226320 A1 | 8/2014 | Halliwell et al. |
| 2015/0009688 A1 | 1/2015 | Timmermans et al. |
| 2015/0176770 A1 | 6/2015 | Wilcox et al. |
| 2016/0081147 A1* | 3/2016 | Guang ............... H05B 33/0803 315/123 |
| 2016/0091147 A1 | 3/2016 | Jiang et al. |
| 2016/0091156 A1 | 3/2016 | Li et al. |
| 2016/0091179 A1 | 3/2016 | Jiang et al. |

(56) References Cited

U.S. PATENT DOCUMENTS

| | | |
|---|---|---|
| 2016/0102813 A1 | 4/2016 | Ye et al. |
| 2016/0178135 A1 | 6/2016 | Ku et al. |
| 2016/0178137 A1 | 6/2016 | Jiang |
| 2016/0178138 A1 | 6/2016 | Jiang |
| 2016/0198535 A1 | 7/2016 | Ye et al. |
| 2017/0167664 A1 | 6/2017 | Li et al. |
| 2017/0211753 A1 | 7/2017 | Jiang et al. |
| 2017/0219169 A1 | 8/2017 | Jiang et al. |

FOREIGN PATENT DOCUMENTS

| | | |
|---|---|---|
| CN | 102121578 | 7/2011 |
| CN | 202125774 | 1/2012 |
| CN | 202216003 | 5/2012 |
| CN | 102518972 | 6/2012 |
| CN | 202302841 | 7/2012 |
| CN | 102720901 | 10/2012 |
| CN | 102777788 | 11/2012 |
| CN | 102889446 | 1/2013 |
| CN | 203068187 | 7/2013 |
| CN | 203240337 | 10/2013 |
| CN | 203464014 | 3/2014 |
| CN | 203489210 | 3/2014 |
| CN | 203549435 | 4/2014 |
| CN | 203615157 | 5/2014 |
| CN | 103851547 | 6/2014 |
| CN | 203771102 | 8/2014 |
| CN | 203927469 | 11/2014 |
| CN | 204268162 | 4/2015 |
| CN | 204300737 | 4/2015 |
| CN | 104595765 | 5/2015 |
| CN | 104633497 | 5/2015 |
| CN | 204420636 | 6/2015 |
| EP | 3146803 | 3/2017 |
| GB | 2519258 | 4/2015 |
| GB | 2523275 | 8/2015 |
| GB | 2531425 | 4/2016 |
| JP | 2008117666 | 5/2008 |
| JP | 2011061056 | 3/2011 |
| KR | 1020120055349 | 5/2012 |
| WO | 2011132120 | 10/2011 |
| WO | 2012129301 | 9/2012 |
| WO | 2013125803 | 8/2013 |
| WO | 2014001475 | 1/2014 |
| WO | 2014118754 | 8/2014 |
| WO | 2015036478 | 3/2015 |

* cited by examiner

LED TUBE LAMP

CROSS-REFERENCE TO RELATED APPLICATIONS

This application is a continuation-in-part application claiming benefits of U.S. application Ser. No. 15/087,088 filed on 2016 Mar. 31, and U.S. application Ser. No. 14/865,387 filed on 2015 Sep. 25, and claiming priority of Chinese Patent Application no. CN201610327806.0 filed on 2016 May 18, Chinese Patent Application no. CN201610044148.4 filed on 2016 Jan. 22, and Chinese Patent Application no. CN201510848766.X filed on 2015 Nov. 27, the disclosures of which are incorporated herein in their entirety by reference.

TECHNICAL FIELD

The instant disclosure relates to illumination devices, and, more particularly, to an LED tube lamp and components thereof comprising the LED light sources, a tube, electronic components, and end caps.

RELATED ART

LED lighting technology is rapidly developing to replace traditional incandescent and fluorescent lightings. LED tube lamps are mercury-free in comparison with fluorescent tube lamps that need to be filled with inert air and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption; therefore, when taking into account all factors, they would typically be considered as a cost effective lighting option.

Referring to Chinese patent application No. 201510056843.8, the application discloses basic structures of an LED tube lamp pertaining to a direct plug type. The LED tube lamp includes a tube and end caps. The end cap includes a power supply and an end case. A light strip is inside the tube and is connected to the power supply. Referring to Chinese patent application No. 201320550914.6, the application discloses a power-adjustable end caps and an LED tube lamp. The end cap of the LED tube lamp comprises a cap body and a rotatable ring for adjusting power. Referring to US patent publication No. US2012146503, the patent discloses a linear LED lamp which includes a lamp and a transparent fluid for heat conduction within the lamp. Referring to US patent publication No. US20140071667, the application discloses a linear tube lamp. The linear tube lamp includes a cylindrical case, a pair of end caps at two ends of cylindrical case, an LED substrate inside the cylindrical case, and LEDs on the LED substrate.

According to prior arts, the basic structure of the present LED tube lamps include a tube, end caps at two ends of the tube, a substrate inside the tube, LEDs on the substrate, and power supply inside the end caps. The tube and the end caps form a sealed space. The energy conversion efficiency from electricity to radiation of traditional LED is improvable; therefore, a portion of the electricity is converted to heat energy released instead of converting to optical radiation. Thus, a heatsink or other related heat conduction and/or heat dissipation structure is needed to be configured around the substrate to improve the heat conduction from the LED chip and substrate to the outside area of the tube to prevent low lighting efficiency of LED chip from overheating. Besides, there is no opening on the tube for pressure releasing, then the reliability of the LED tube lamp is low. Furthermore, there is a risk of electric shock to the user when the ruptured or broken LED tube lamp is uninstalled in the condition without electric shock prevention design.

SUMMARY

Prior LED tube lamps have some issues. When the LED tube lamp operates, the electronic components of the power supply inside the end cap continuously generate heat, and the generated heat cannot be dissipated by convection of air. Instead, the heat accumulates inside the end cap, which negatively affects the products' life span and reliability. According to the equation of state of a hypothetical ideal gas:

$$PV=nRT$$

Wherein the P is the pressure of the gas, V is the volume of the gas, n is the amount of substance of the gas, R is the ideal gas constant, and T is the absolute temperature of the gas. Under the circumstances that the volume and the amount of substance of the gas are fixed, the temperature is directly proportional to the pressure. In other words, the higher the temperature is, the higher the pressure is; the lower the temperature is, the lower the pressure is. Under the circumstances that the internal space of the end cap is sealed or is almost sealed (e.g., the end cap and the tube are connected to each other in an adhesive manner such that there is no gap between the end cap and the tube or there are extremely small gaps between the end cap and the tube), the volume and the amount of substance of the gas inside the end cap are constant or proximately constant, and, consequently, the variation of the temperature causes the variation of the pressure. Sudden change of the temperature may cause sudden increase or decrease of the pressure inside the end cap. As a result, the electrical connection may be broken, e.g., the connection between a printed circuit board and a bendable circuit sheet may be detached. In addition, since continuous, high temperature of the end cap causes the increase of the pressure inside the end cap, the electronic components continuously suffering high temperature and high pressure are easily damaged. High temperature and high pressure not only negatively affect the reliability of the LED tube lamp, but also raise the risk of spontaneous combustion of the electronic components, which may cause fire accident.

During an assembling process of the LED tube lamp, the end cap might have resistance to be assembled to the tube because the pressure inside the tube and the end cap increases along with the assembling process of the tube and the end cap, which negatively affect the efficiency of assembling. In addition, during a disassembling process of the LED tube lamp, the end cap might have resistance to be disassembled from the tube because of the negative pressure inside the tube and the end cap (the negative pressure results from the lowering of the temperature inside the tube and the end cap).

When the LED tube lamp is being installed to or being uninstalled from a lamp base, there is a risk of electric shock to the user if the LED tube lamp is ruptured or broken or if the user accidently contacts exposed conductive pins at one end of the LED tube lamp while the other end is still electrically connected to the lamp base.

To address the above issues, the instant disclosure provides embodiments of an LED tube lamp.

According to an embodiment, an LED tube lamp comprises a tube, two end caps, a power supply, and an LED light strip. The two end caps are respectively at two opposite ends of the tube. The power supply is in one or both of the end caps. The power supply may be in the form of a single integrated unit (e.g., with all components of the power supply are within a body) disposed in an end cap at one end of the tube. Alternatively, the power supply may be in form of two separate parts (e.g., with the components of the power supply are separated into two pieces) respectively disposed in two end caps. The LED light strip is in the tube. The LED light strip is provided with a plurality of LED light sources disposed thereon. The LED light sources are electrically connected to the power supply via the LED light strip. The end cap comprises a lateral wall, an end wall, and at least one opening. The lateral wall is substantially coaxial with the tube and is connected to the tube. The end wall is substantially perpendicular to an axial direction of the lateral wall and is connected to an end of the lateral wall away from the tube. The at least one opening penetrates through the end cap.

According to an embodiment, the at least one opening penetrates through the end wall.

According to an embodiment, the at least one opening penetrates through the end cap with a light sensor inside the end cap collimating with the opening.

According to an embodiment, an axial direction of the at least one opening is substantially parallel with the axial direction of the lateral wall, and the at least one opening is aligned with an inner surface of the lateral wall.

According to an embodiment, an axial direction of the at least one opening and the axial direction of the lateral wall define an acute angle.

According to an embodiment, a radial area of the at least one opening is less than $1/10$ of a radial area of the end wall.

According to an embodiment, a radial area of the at least one opening is 0.5 mm$^2$ to 3 mm$^2$.

According to an embodiment, the end cap further comprises a dust-proof net, and the dust-proof net covers the at least one opening.

According to an embodiment, the end cap further comprises a plurality of openings asymmetrically arranged on the end wall.

According to an embodiment, an end wall radius is defined between the center and the periphery of the end wall, and a distance between the at least one opening and the center of the end wall is from $2/5$ to $4/5$ of the end wall radius.

According to an embodiment, the LED light strip comprises a bendable circuit sheet. Moreover, in some embodiments, the length of the bendable circuit sheet is greater than the length of the tube (not including the length of the two end caps respectively connected to two ends of the tube), or at least greater than a central portion of the tube between two transition regions (e.g., where the circumference of the tube narrows) on either end. In one embodiment, the longitudinally projected length of the bendable circuit sheet as the LED light strip is larger than the length of the tube.

According to an embodiment, the at least one opening is arc-shaped.

According to an embodiment, the distance of the interval of the opening is between 0.5 mm to 1.5 mm.

According to an embodiment, the length of the long edge of the opening is between 1 mm to 7 mm.

According to an embodiment, the power supply is divided into two parts respectively in the two end caps.

According to an embodiment, the tube comprises two rear end regions, two transition regions, and a main body region, the two rear end regions are at two opposite ends of the main body region, the two transition regions are respectively between the two rear end regions and the main body region, and the two end caps are respectively connected to the two rear end regions. In other words, in the transition region, the tube narrows, or tapers to have a smaller diameter when moving along the length of the tube from the main body region to the rear end region. The tapering/narrowing may occur in a continuous, smooth manner (e.g., to be a smooth curve without any linear angles). By avoiding angles, in particular any acute angles, the tube is less likely to break or crack under pressure. Furthermore, the transition region is formed by two curves at both ends, wherein one curve is toward inside of the tube and the other curve is toward outside of the tube. For example, one curve closer to the main body region is convex from the perspective of an inside of the tube and one curve closer to the rear end region is concave from the perspective of an inside of the tube. The transition region of the tube in one embodiment includes only smooth curves, and does not include any angled surface portions.

According to an embodiment, the tube and the end cap are secured by a hot melt adhesive.

According to another embodiment, an LED tube lamp comprises a tube, two end caps, a power supply, and an LED light strip. The two end caps are respectively at two opposite ends of the tube. The power supply is in one or both of the end caps. The LED light strip is in the tube. The LED light strip is provided with a plurality of LED light sources disposed thereon. The LED light sources are electrically connected to the power supply via the LED light strip. The end cap comprises a lateral wall and an end wall. The lateral wall is substantially coaxial with the tube and is connected to the tube. The end wall is substantially perpendicular to an axial direction of the lateral wall and is connected to an end of the lateral wall away from the tube. The power supply comprises a printed circuit board and electronic components. The printed circuit board comprises a first surface and a second surface opposite to and substantially parallel with each other. The first surface and the second surface of the printed circuit board are substantially perpendicular to the axial direction of the lateral wall. The second surface of the printed circuit board is closer to the end wall of the end cap which at least part of the power supply is thereon than the first surface of the printed circuit board is. Most of the electronic components are on the first surface of the printed circuit board.

According to another embodiment, the second surface of the printed circuit board contacts an inner surface of the end wall.

According to another embodiment, the end cap comprises at least one opening. The at least one opening penetrates through the end wall, and the second surface of the printed circuit board covers the at least one opening.

According to another embodiment, the power supply further comprises a heat-dissipating element. The heat-dissipating element is on the second surface of the printed circuit board and extends to inside the at least one opening.

According to another embodiment, the electronic component of the power supply further comprises a driving module including an inductor, a transistor, or an integrated circuit. The driving module is on the second surface of the printed circuit board and locates adjacently to the at least one opening.

According to another embodiment, the heat-dissipating element and the at least one opening are substantially sealed in the radial direction of the at least one opening.

According to another embodiment, there is a gap between the heat-dissipating element and the at least one opening in the radial direction of the at least one opening.

According to another embodiment, at least one component of the driving module and the at least one opening are substantially sealed in the radial direction of the at least one opening.

According to another embodiment, there is a gap between the driving module and the at least one opening in the radial direction of the at least one opening.

According to another embodiment, the at least one opening penetrates through the end cap with a light sensor on the second surface of the printed circuit board inside the end cap collimating with the opening.

According to another embodiment, the tube comprises two rear end regions, two transition regions, and a main body region, the two rear end regions are at two opposite ends of the main body region, the two transition regions are respectively between the two rear end regions and the main body region, and the two end caps are respectively connected to the two rear end regions. In other words, in the transition region, the tube narrows, or tapers to have a smaller diameter when moving along the length of the tube from the main body region to the rear end region. The tapering/narrowing may occur in a continuous, smooth manner (e.g., to be a smooth curve without any linear angles). By avoiding angles, in particular any acute angles, the tube is less likely to break or crack under pressure. Furthermore, the transition region is formed by two curves at both ends, wherein one curve is toward inside of the tube and the other curve is toward outside of the tube. For example, one curve closer to the main body region is convex from the perspective of an inside of the tube and one curve closer to the rear end region is concave from the perspective of an inside of the tube. The transition region of the tube in one embodiment includes only smooth curves, and does not include any angled surface portions.

According to yet another embodiment, an LED tube lamp comprises a tube, two end caps, a power supply, and an LED light strip. The two end caps are respectively at two opposite ends of the tube. The power supply is in one or both of the end caps. The LED light strip is in the tube. The LED light strip is provided with a plurality of LED light sources disposed thereon. The LED light sources are electrically connected to the power supply via the LED light strip. The end cap comprises a lateral wall, an end wall, and at least one opening. The lateral wall is substantially coaxial with the tube and is connected to the tube. The end wall is substantially perpendicular to an axial direction of the lateral wall and is connected to an end of the lateral wall away from the tube. The at least one opening penetrates through the end wall. The power supply comprises a printed circuit board, electronic components, and a heat-dissipating element. The printed circuit board comprises a first surface and a second surface opposite to and substantially parallel with each other. The first surface and the second surface of the printed circuit board are substantially parallel with the axial direction of the lateral wall. The electronic components and the heat-dissipating element are on the first surface of the printed circuit board. The heat-dissipating element is closer to the at least one opening of the end cap than the electronic components are.

According to yet another embodiment, an LED tube lamp comprises a tube, two end caps, a power supply, and an LED light strip. The two end caps are at two opposite ends of the tube. The power supply is in one or both of the end caps. The power supply may be in the form of a single integrated unit (e.g., with all components of the power supply are within a body) disposed in an end cap at one end of the tube. Alternatively, the power supply may be in form of two separate parts (e.g., with the components of the power supply are separated into two pieces) respectively disposed in two end caps. The LED light strip is in the tube. The LED light strip is provided with a plurality of LED light sources disposed thereon. The LED light sources are electrically connected to the power supply via the LED light strip. The end cap comprises a lateral wall, an end wall, and at least one opening. The lateral wall is substantially coaxial with the tube and is connected to the tube. The end wall is substantially perpendicular to an axial direction of the lateral wall and is connected to an end of the lateral wall away from the tube. The at least one opening penetrates through the end wall. The power supply comprises a printed circuit board, electronic components. The printed circuit board comprises a first surface and a second surface opposite to and substantially parallel with each other. The first surface and the second surface of the printed circuit board are substantially parallel with the axial direction of the lateral wall. The electronic components are on the first surface of the printed circuit board. The electronic components comprises a driving module which is closer to the at least one opening of the end cap than the other electronic components are.

According to the embodiments of the LED tube lamp of the instant disclosure, the bendable circuit sheet of the LED light strip is mounted on the inner surface of the tube, such that the tube will not remain a straight appearance when it is partially ruptured or broken. Therefore, user can easily aware that the structure of the tube is damaged and stop using it. The possibility of electric shock by using ruptures or broken LED tube lamp could be decreased. In addition, the bendable circuit sheet of the LED light strip is electrically connected to the power supply directly by the freely extending end portion formed at one end of the LED light strip rather than by traditional wire bonding, which remarkably lowers down the possibility of disconnection occurred between the LED light strip and the power supply during manufacturing, transportation, and usage of the LED tube lamp. Moreover, in some embodiments, the length of the bendable circuit sheet is greater than the length of the tube (not including the length of the two end caps respectively connected to two ends of the tube), or at least greater than a central portion of the tube between two transition regions (e.g., where the circumference of the tube narrows) on either end. In one embodiment, the longitudinally projected length of the bendable circuit sheet as the LED light strip is larger than the length of the tube.

According to yet another embodiment, the opening is good for pressure releasing, and a light sensor can be configured inside the end cap to collimate with the opening for light detection and electric shock prevention during installation or uninstallation of the LED tube lamp to a lamp base. Thus, the bendable circuit sheet of the LED light strip combining with a light sensor could provide more superior safety in terms of electric shock prevention.

According to the embodiments of the LED tube lamp of the instant disclosure, when the LED tube lamp operates, the heat generated by the electronic components of the power supply inside the end cap can be efficiently dissipated through the at least one opening. The at least one opening can also function as a pressure-relieving tunnel. If the air inside the end cap expands, the expanding air can be released through the at least one opening such that the pressure inside the end cap won't vary with the temperature. As a result, the products' life span can be longer and the product can have better reliability.

Concisely, during an assembling process or a disassembling process of the LED tube lamp, the end cap can be easily assembled to or disassembled from the tube because the gas can flow via the opening, and the pressure inside the tube and the end cap can remain constant (equal to the pressure outside the tube and the end cap); therefore, the efficiency of assembling or dissembling can be improved. The light sensor can sense brightness outside the end cap and, accordingly, the circuit of the power supply can be opened or closed according to brightness the light sensor senses; therefore, when the LED tube lamp is being installed to or being uninstalled from a lamp base, the circuit of the power supply is opened according to brightness sensed by the light sensor. Thus there is no risk of electric shock to the user.

DETAILED DESCRIPTION

Figure 1:
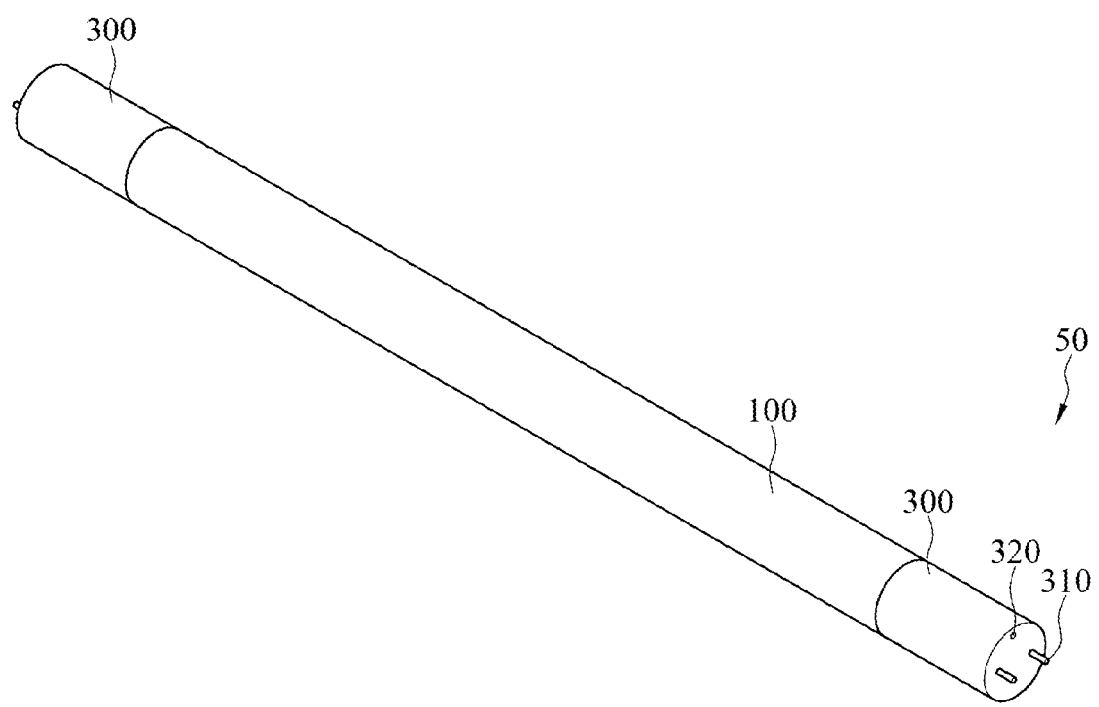
FIG. 1 illustrates a perspective view of an LED tube lamp according to an embodiment of the instant disclosure.

The instant disclosure provides an LED tube lamp to solve the abovementioned problems. The instant disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, part or section. Thus, a first element, component, region, part or section discussed below could be termed a second element, component, region, part or section without departing from the teachings of the present disclosure.

The following description with reference to the accompanying drawings is provided to explain the exemplary embodiments of the disclosure. Note that in the case of no conflict, the embodiments of the present disclosure and the features of the embodiments may be arbitrarily combined with each other.

As indicated in the section of the cross-reference, the instant disclosure claims priority of several Chinese patent applications, and the disclosures of which are incorporated herein in their entirety by reference. When it comes to claim construction, the claims, specification, and prosecution history of the instant disclosure controls if any inconsistency between the instant disclosure and the incorporated disclosures exists.

Figure 2:
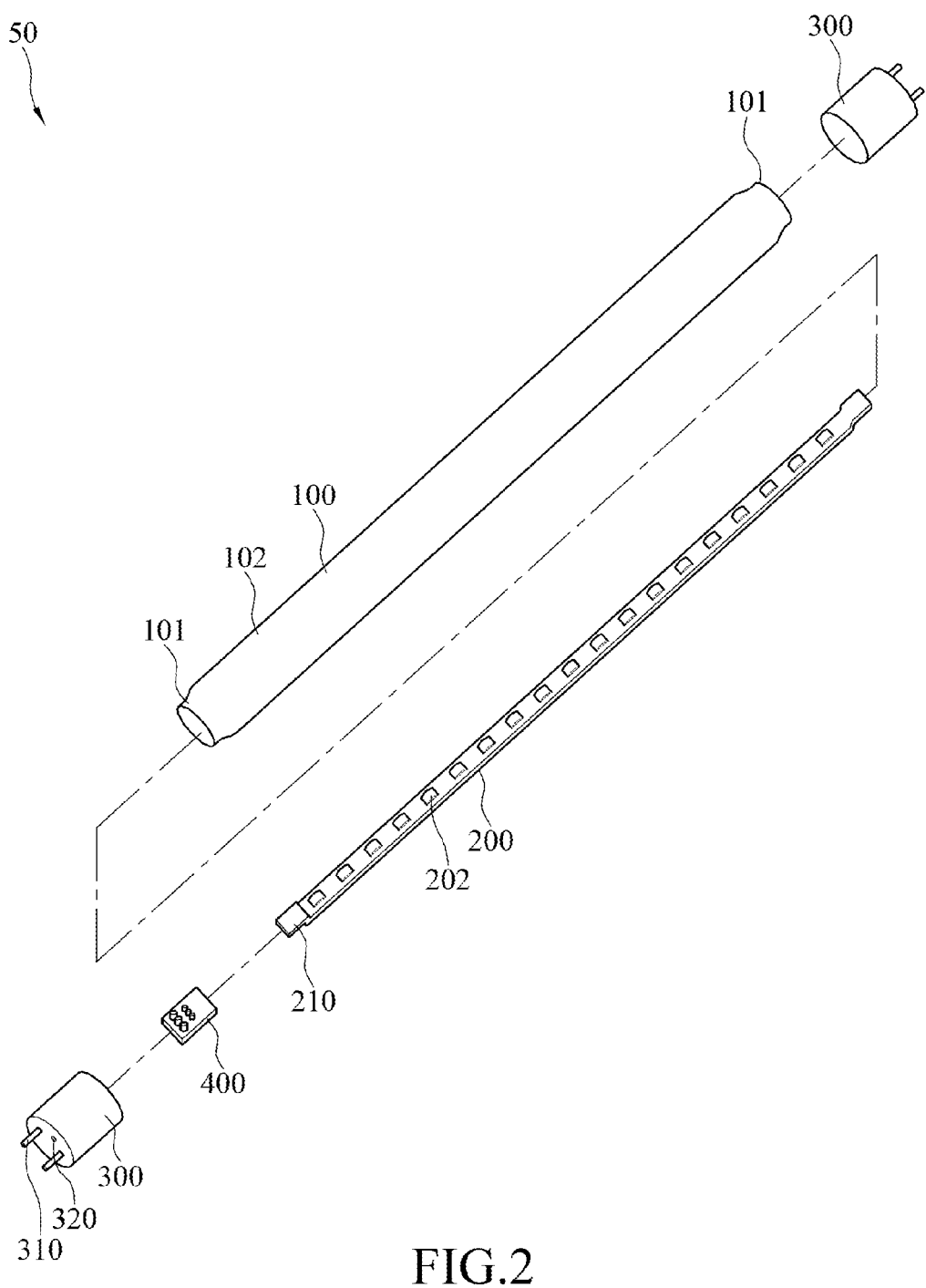
FIG. 2 illustrates an exploded view of an LED tube lamp according to an embodiment of the instant disclosure.

Referring to FIG. 1 and FIG. 2, the instant disclosure provides an embodiment of an LED tube lamp 50 which comprises a tube 100, an LED light strip 200, and end caps 300. The LED light strip 200 is disposed inside the tube 100. Two end caps 300 are respectively disposed on two ends of the tube 100. The LED tube lamp 100 can be a plastic tube, a glass tube, a plastic-metal combined tube, or a glass-metal combined tube. The two end caps 300 can have the same size or have different sizes. Referring to FIG. 2, several LED light sources 202 are disposed on the LED light strip 200, and a power supply 400 is disposed in the end cap 300. The power supply 400 may be in the form of a single integrated unit (e.g., with all components of the power supply 400 are within a body) disposed in an end cap 300 at one end of the tube 100. Alternatively, the power supply 400 may be in form of two separate parts (e.g., with the components of the power supply 400 are separated into two pieces) respectively disposed in two end caps 300. The LED light sources 202 and the power supply 400 can be electrically connected to each other via the LED light strip 200. The LED light strip 200 can be a bendable circuit sheet. Moreover, in some embodiments, the length of the bendable circuit sheet is greater than the length of the tube 100 (not including the length of the two end caps 300 respectively connected to two ends of the tube 100), or at least greater than a central portion of the tube 100 between two transition regions (e.g., where the circumference of the tube narrows) on either end. In one embodiment, the longitudinally projected length of the bendable circuit sheet as the LED light strip 200 is larger than the length of the tube 100. Middle part of the LED light strip 200 can be mounted on the inner surface of the tube 100. Instead, two opposite, short edges of the LED light strip 200 are not mounted on the inner surface of the tube 100. The LED light strip 200 comprises two freely extending end portions 210. The two freely extending end portions 210 are respectively disposed on the two opposite, short edges of the LED light strip 200. The two freely extending end portions 210 respectively extend outside the tube 100 through two holes at two opposite ends of the tube 100 along the axial direction of the tube 100. The two freely extending end portions 210 can respectively extend to inside area of the end caps 300 and can be electrically connected to the power supply 400. Each of the end caps 300 comprises a pair of hollow conductive pins 310 utilized for being connected to an outer electrical power source. When the LED tube lamp 50 is installed to a lamp base, the hollow conductive pins 310 are plugged into corresponding conductive sockets of the lamp base such that the LED tube lamp 50 can be electrically connected to the lamp base. In one embodiment, the LED light strip 2 includes a bendable circuit sheet having a conductive wiring layer and a dielectric layer that are arranged in a stacked manner, wherein the wiring layer and the dielectric layer have same area or the wiring layer has a bit less area (not shown) than the dielectric layer. The LED light source 202 is disposed on one surface of the wiring layer, the dielectric layer is disposed on the other surface of the wiring layer that is away from the LED light sources 202. The wiring layer is electrically connected to the power supply 400 to carry direct current (DC) signals. Meanwhile, the surface of the dielectric layer away from the wiring layer is fixed to the inner circumferential surface of the tube 100 by means of the adhesive sheet (not shown). The wiring layer can be a metal layer or a power supply layer including wires such as copper wires.

In another embodiment, the outer surface of the wiring layer or the dielectric layer may be covered with a circuit protective layer made of an ink with function of resisting soldering and increasing reflectivity (not shown). Alternatively, the dielectric layer can be omitted and the wiring layer can be directly bonded to the inner circumferential surface of the tube 100, and the outer surface of the wiring layer is coated with the circuit protective layer. Whether the wiring layer has a one-layered, or two-layered structure, the circuit protective layer can be adopted. In some embodiments, the circuit protective layer is disposed only on one side/surface of the LED light strip 200, such as the surface having the LED light source 202. In some embodiments, the bendable circuit sheet is a one-layered structure made of just one wiring layer, or a two-layered structure made of one wiring layer and one dielectric layer, and thus is more bendable or flexible to curl when compared with the conventional three-layered flexible substrate (one dielectric layer sandwiched with two wiring layers). As a result, the bendable circuit sheet of the LED light strip 200 can be installed in a tube with a customized shape or non-tubular shape, and fitly mounted to the inner surface of the tube 100. The bendable circuit sheet closely mounted to the inner surface of the tube 100n is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers and multiple layers of the dielectric layers, in which the dielectric layers and the wiring layers are sequentially stacked in a staggered manner, respectively (not shown). These stacked layers are away from the surface of the outermost wiring layer which has the LED light source 202 disposed thereon and is electrically connected to the power supply 400. Moreover, the projected length of the bendable circuit sheet is greater than the length of the tube 100.

In one embodiment, the LED light strip 200 includes a bendable circuit sheet having in sequence a first wiring layer, a dielectric layer, and a second wiring layer (not shown). The thickness of the second wiring layer is greater than that of the first wiring layer, and/or the projected length of the LED light strip 200 is greater than that of the tube 100. The end region of the light strip 200 extending beyond the end portion of the tube 100 without disposition of the light source 202 is formed with two separate through holes to respectively electrically communicate the first wiring layer and the second wiring layer (not shown). The through holes are not communicated to each other to avoid short.

In this way, the greater thickness of the second wiring layer allows the second wiring layer to support the first wiring layer and the dielectric layer, and meanwhile allow the LED light strip 200 to be mounted onto the inner circumferential surface without being liable to shift or deform, and thus the yield rate of product can be improved. In addition, the first wiring layer and the second wiring layer are in electrical communication such that the circuit layout of the first wiring later can be extended downward to the second wiring layer to reach the circuit layout of the entire LED light strip 200. In some circumstances, the first wiring connects the anode and the second wiring connects the cathode. Moreover, since the land for the circuit layout becomes two-layered, the area of each single layer and therefore the width of the LED light strip 200 can be reduced such that more LED light strips 200 can be put on a production line to increase productivity. Furthermore, the first wiring layer and the second wiring layer of the end region of the LED light strip 200 that extends beyond the end portion of the tube 100 without disposition of the light source 202 can be used to accomplish the circuit layout of a power supply 400 so that the power supply 400 can be directly disposed on the bendable circuit sheet of the LED light strip 200.

As shown in FIG. 2, the tube 100 comprises two rear end regions 101, two transition regions, and one main body region 102. The two rear end regions 101 are at two opposites ends of the main body region 102. The two transition regions are respectively between the two rear end regions 101 and the main body region 102. The two end caps 300 are respectively connected to the two rear end regions 101. The rear end regions 101 are the portions of the tube 100 shrunk in the radial direction. The rear end regions 101 form shrunk holes. The bore of the rear end region 101 is less than that of the main body region 102. In other words, in the transition region, the tube 100 narrows, or tapers to have a smaller diameter when moving along the length of the tube 100 from the main body region 102 to the rear end region 101. The tapering/narrowing may occur in a continuous, smooth manner (e.g., to be a smooth curve without any linear angles). By avoiding angles, in particular any acute angles, the tube 100 is less likely to break or crack under pressure. Furthermore, the transition region is formed by two curves at both ends, wherein one curve is toward inside of the tube 100 and the other curve is toward outside of the tube 100. For example, one curve closer to the main body region 102 is convex from the perspective of an inside of the tube 100 and one curve closer to the rear end region 101 is concave from the perspective of an inside of the tube 100. The transition region of the tube 100 in one embodiment includes only smooth curves, and does not include any angled surface portions. As shown in FIG. 1, the appearance of the LED tube lamp 50 is identical from the tube 100 to the end caps 300, meaning that the outer surfaces of the end caps 300 are aligned with that of the tube 100.

Figure 3:
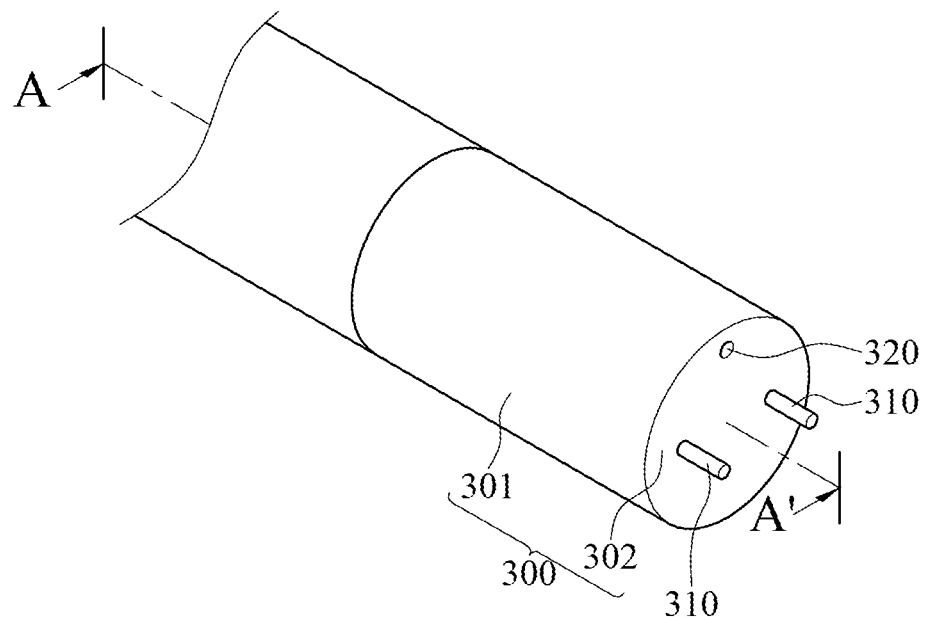
FIG. 3 illustrates a partial view of an LED tube lamp according to an embodiment of the instant disclosure.
Figure 4:
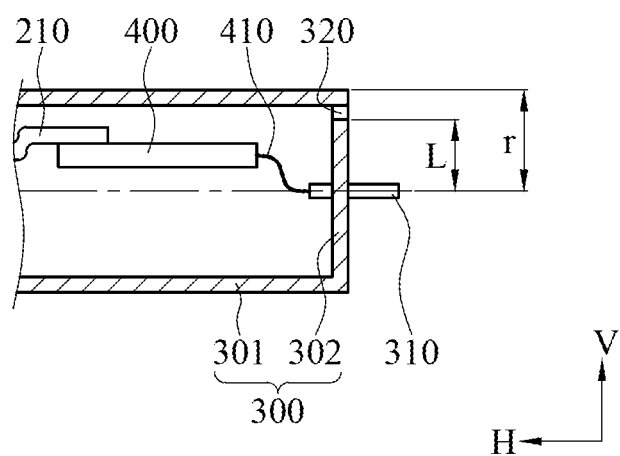
FIG. 4 illustrates a part of a cross section of FIG. 3 along the line A-A'.

Referring to FIG. 3 and FIG. 4, FIG. 3 is a partial view of the LED tube lamp 50, and FIG. 4 is a cross section of FIG. 3 along the line A-A'. The end cap 300 of the embodiment further comprises a lateral wall 301, an end wall 302, and an opening 320. The lateral wall 301 is tubular shape. The lateral wall 301 and the tube 100 are coaxial and are connected to each other. More specifically, the lateral wall 301 and the tube 100 are substantially coaxial but the alignment of the axial directions of the lateral wall 301 and the tube 100 may have a slightly shift due to manufacturing tolerance. The end wall 302 is substantially perpendicular to the axial direction of the lateral wall 301. The end wall 302 is connected to an end of the lateral wall 301 away from the tube 100. More specifically, the end wall 302 is substantially perpendicular to the axial direction of the lateral wall 301 but the angle between the end wall 302 and the axial direction of the lateral wall 301 may not be exactly 90 degrees maybe due to manufacturing tolerance. This is still within the scope of substantially perpendicular. Even if the end wall 302 relative to the axial direction of the lateral wall 301 is slightly inclined, the end wall 302 and the lateral wall 301 can still form a receiving space for receiving the power supply 400 and can mate the lamp base. The end wall 302 and the lateral wall 301 form an inner space of the end cap 300. The power supply 400 is disposed in the inner space of the end cap 300. The opening 320 penetrates through the end wall 302. The inner space of the end cap 300 can communicate with outside area through the opening 320. Air can flow through the opening 320 between the inner space of the end cap 300 and outside area. Moreover, the opening 320 is good for pressure releasing, and a light sensor can be configured inside the end cap 300 to collimate with the opening 320 for light detection and electric-shock prevention during installation of the LED tube lamp 50 to a lamp base (not shown).

The power supply 400 can be a module, e.g., an integrated power module. The power supply 400 may be in the form of a single integrated unit (e.g., with all components of the power supply 400 are within a body) disposed in an end cap 300 at one end of the tube 100. Alternatively, the power supply 400 may be in form of two separate parts (e.g., with the components of the power supply 400 are separated into two pieces) respectively disposed in two end caps 300. The power supply 400 further comprises a pair of metal wires 410. The metal wires 410 extend from the power supply 400 to the inside of the hollow conductive pins 310 and are connected to the hollow conductive pins 310. In other words, the power supply 400 can be electrically connected to the outer electrical power source through the metal wires 410 and the hollow conductive pins 310. The hollow conductive pins 310 are disposed outside the end wall 302 and extend along the axial direction of the lateral wall 301. Referring to FIG. 4, when the LED tube lamp 50 is installed to a horizontal lamp base (not shown), the axle of the lateral wall 301 is substantially parallel with the horizontal direction "H", and the pair of the hollow conductive pins 310 are at the same altitude and overlap each other in the vertical direction "V". Under the circumstances, the altitude of the opening 320 is higher than that of the axle of the lateral wall 301 in the vertical direction "V".

In the embodiment, as shown in FIG. 4, the axial direction of the opening 320 is substantially parallel with that of the lateral wall 301. The axial direction of the opening 320 is defined as an extending direction of the opening 320 extending from the inner surface of the end wall 302 (the surface inside the end cap 300) to the outer surface of the end wall 302 (the surface outside). In the embodiment, the opening 320 is substantially aligned with the inner surface of the lateral wall 301 (the surface inside the end cap 300). Specifically, a part of the inner surface of the opening 320 is substantially aligned with a part of the inner surface of the lateral wall 301.

In the embodiment, as shown in FIG. 4, an end wall radius "r" is defined as the shortest distance between the center of the end wall 302 (the point of the end wall 302 through which the axle of the lateral wall 301 passes) and the periphery of the end wall 302 in the radial direction of the end cap 300 (the direction substantially parallel with the vertical direction "V" shown in FIG. 4). A distance "L" is defined as the shortest distance between the center of the end wall 302 and the opening 320 in the radial direction of the end cap 300. The distance "L" is from ⅖ to ⅘ of the end wall radius "r". That is to say, the relation of the opening 320 and the end wall 302 matches an equation listed below:

$$0.4r \le L \le 0.8r$$

When the position of the opening 320 relative to the center of the end wall 302 matches the aforementioned equation, the convection of air between the LED tube lamp 50 and outside area can be more efficiently.

Figure 5:
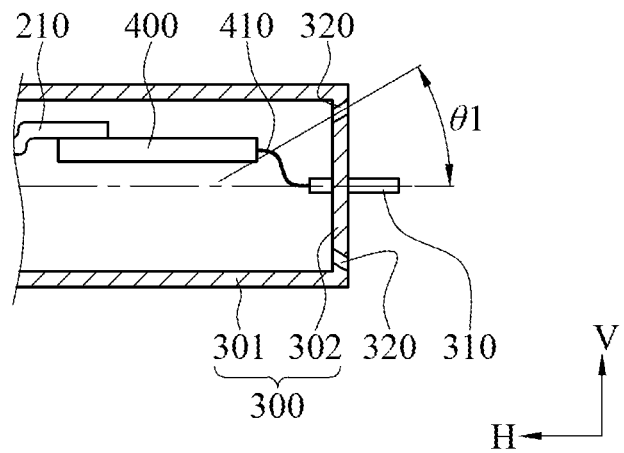
FIG. 5 illustrates a part of a cross section of an LED tube lamp according to an embodiment of the instant disclosure.

Referring to FIG. 5, the difference between the LED tube lamps 50 of FIG. 5 and FIG. 4 is the forms of the openings 320. In the embodiment, as shown in FIG. 5, the opening 320 can be inclined. The axial direction of the opening 320 and the axial direction of the lateral wall 301 define an angle θ1. The angle θ1 is an acute angle. The axial direction of the opening 320 is defined as an extending direction of the opening 320 extending from the inner surface of the end wall 302 to the outer surface of the end wall 302. When the LED tube lamp 50 is installed to the horizontal lamp base, the axial directions of the tube 100 and the end cap 300 are substantially parallel with the horizontal direction "H", and the altitude of the opening 320 is higher than that of the axle of the tube 100 and the end cap 300 in the vertical direction "V". When the power supply 400 generates heat in operation, the inclined opening 320 shown in FIG. 5 is beneficial to the process that heated air rises (along the vertical direction "V") and flows to outside area through the opening 320.

Additionally, two openings 320 are acceptable. As shown in FIG. 5, two inclined openings 320 are substantially symmetrical to each other. When the LED tube lamp 50 is installed to the horizontal lamp base, the axial directions of the tube 100 and the end cap 300 are substantially parallel with the horizontal direction "H", and the altitude of one of the two openings 320 is higher than that of the axle of the tube 100 and the end cap 300 in the vertical direction "V" while the other one of the two openings 320 is lower than that of the axle of the tube 100 and the end cap 300 in the vertical direction "V". Each of the axial directions of the two openings 320 and the axial direction of the lateral wall 301 respectively define an acute angle. When the power supply 400 generates heat in operation, the upper opening 320 shown in FIG. 5 is beneficial to the process that heated air rises (along the vertical direction "V") and flows to outside area through the upper opening 320, and the lower opening 320 shown in FIG. 5 is beneficial to the process that cool air from outside area flow to inside of the end cap 300 through the lower opening 320. As a result, convection of the heated air and cool air is improved, and, consequently, the effect of heat dissipation is better.

Figure 6:
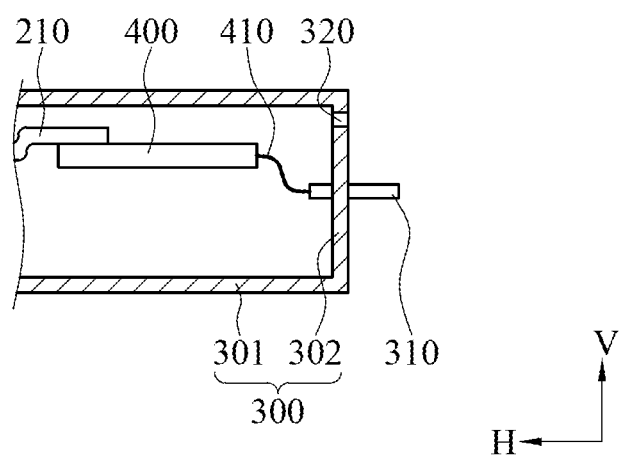
FIG. 6 illustrates a part of a cross section of an LED tube lamp according to an embodiment of the instant disclosure.

Referring to FIG. 6, the difference between the LED tube lamps 50 of FIG. 6 and FIG. 4 is the forms of the openings 320. As shown in FIG. 6, the opening 320 is not aligned with the inner surface of the lateral wall 301. Comparing to the opening 320 of FIG. 4, the opening 320 of FIG. 6 is away from the end wall 302.

If the opening 320 is too large, dust from outside area may easily pass through the opening 320 and enter the inner space of the end cap 300. Dust may accumulate on the power supply 400 and negatively affect the effect of heat dissipation. To prevent dust from passing through the opening 320, the radial area of the opening 320 is preferably less than 1/10 of the radial area of the end wall 302. Under the circumstances, dust is restricted to pass through the opening 320 to enter the inner space of the end cap 300. In an example that the LED tube lamp 50 is a T8 tube lamp of which the external diameter of the tube 100 is 25 mm to 28 mm, and the external diameter of the end cap 300 (i.e., the diameter of the end wall 302 in the vertical direction "V" shown in FIG. 4) is equal to that of the tube 100. If the diameter of the end wall 302 in the vertical direction "V" shown in FIG. 4 is 25 mm, the area of the end wall 302 in the vertical direction "V" is 490.625 $mm^2$ (square of the radius of the end wall 302 times 3.14), and the bore area (the radial area) of the opening 320 in the vertical direction "V" is 0.5 $mm^2$ to 6 $mm^2$. For example, the radial area of the opening 320 is 6 $mm^2$ and the radial area of the end wall 302 is 490.625 $mm^2$, the radial area of the opening 320 is about 1/100 of the radial area of the end wall 302. Under the circumstances, dust is hard to pass through the opening 320 to enter the inner space of the end cap 300. In different embodiments, the bore area (the radial area) of the opening 320 in the vertical direction "V" is 0.5 $mm^2$ to 3 $mm^2$. Under the circumstances, dust is much harder to pass through the opening 320 to enter the inner space of the end cap 300.

In different embodiments, the end cap 300 further comprises a dust-proof net (not shown). The dust-proof net is a net with fine meshes. The dust-proof net can cover the opening 320. For example, the dust-proof net can be mounted on the outer surface or the inner surface of the end wall 302 and cover the opening 320. As a result, the dust-proof net can prevent dust from entering the opening 320 and keep ventilation well.

Figure 7:
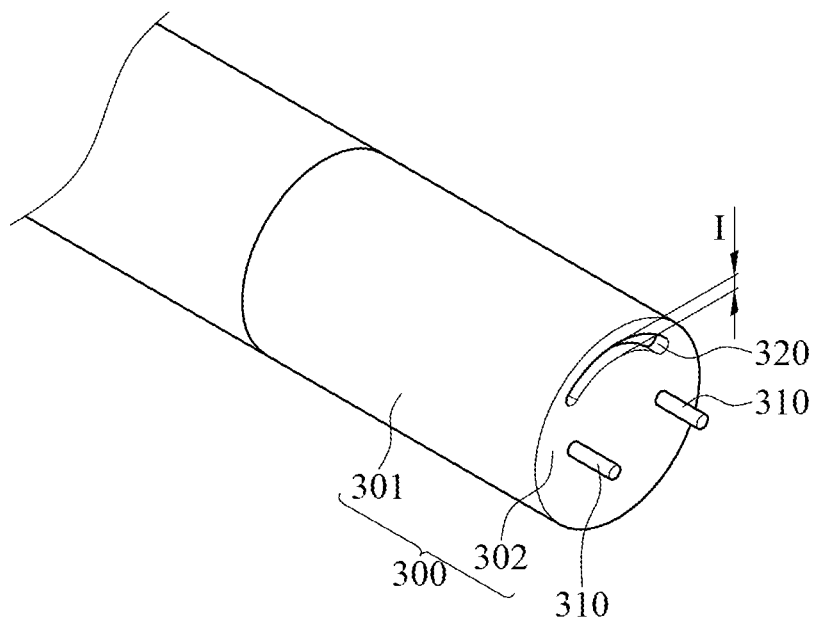
FIGS. 7 to 14 illustrate partial views of LED tube lamps according to several embodiments of the instant disclosure.

Referring to FIG. 7, the difference between the end caps 300 of FIG. 7 and FIG. 3 is the forms of the openings 320. The opening 320 shown in FIG. 3 is a circular opening. In the embodiment, the opening 320 shown in FIG. 7 is an arc-shaped opening which is long and flat. The opening 320 shown in FIG. 7 includes two opposite long edges 3201 (arc edges) and two opposite short edges 320s between the two long edges 3201. The opening 320 has an interval "I" which is the shortest distance between the two long edges 3201. Under the circumstances, the interval "I" of the opening 320 is much shorter than the length of the long edge 3201. Even if the interval "I" of the opening 320 is equal to or slightly less than the diameter (i.e., the bore) of the opening 320 shown in FIG. 3, the bore area of the opening 320 shown in FIG. 7 is still greater than that of the opening 320 shown in FIG. 3. As a result, the opening 320 of FIG. 7 can not only prevent most of the dust from passing through but also keep ventilation well. In an embodiment, the distance of the interval "I" of the opening is between 0.5 mm to 1.5 mm, and the length of the long edge 3201 of the opening is between 1 mm to 7 mm.

In different embodiments, the number, the shape, the position, or the arrangement of the opening(s) 320 can be varied according to different design. Details are described below.

Figure 8:
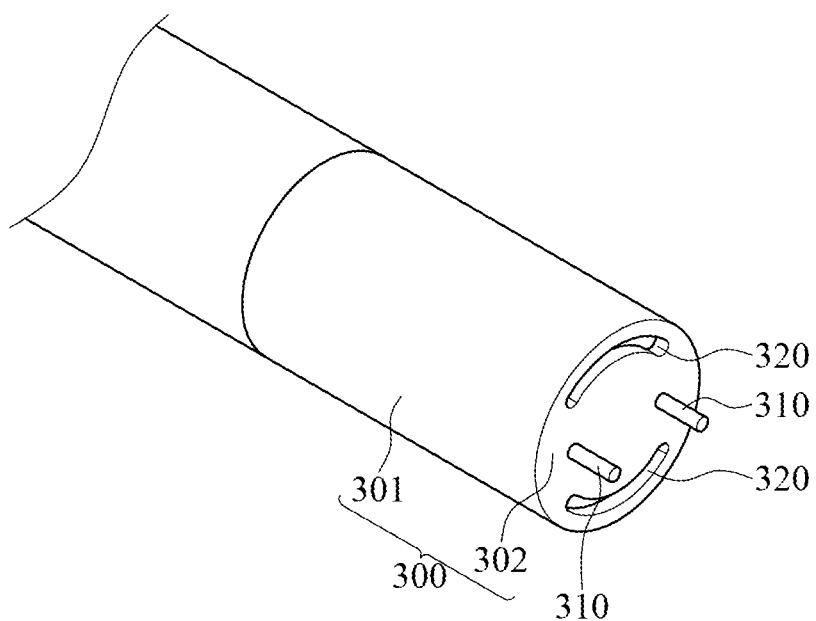

Referring to FIG. 8, the difference between the end caps 300 of FIG. 8 and FIG. 7 is the amount and forms of the openings 320. In the embodiment, there are two openings 320 shown in FIG. 8, and the two openings 320 are substantially symmetrical to each other. The two symmetrical openings 320 shown in FIG. 8 are beneficial to convection of heated air and cool air. The better the convection is, the better the effect of heat dissipation is.

Figure 9:
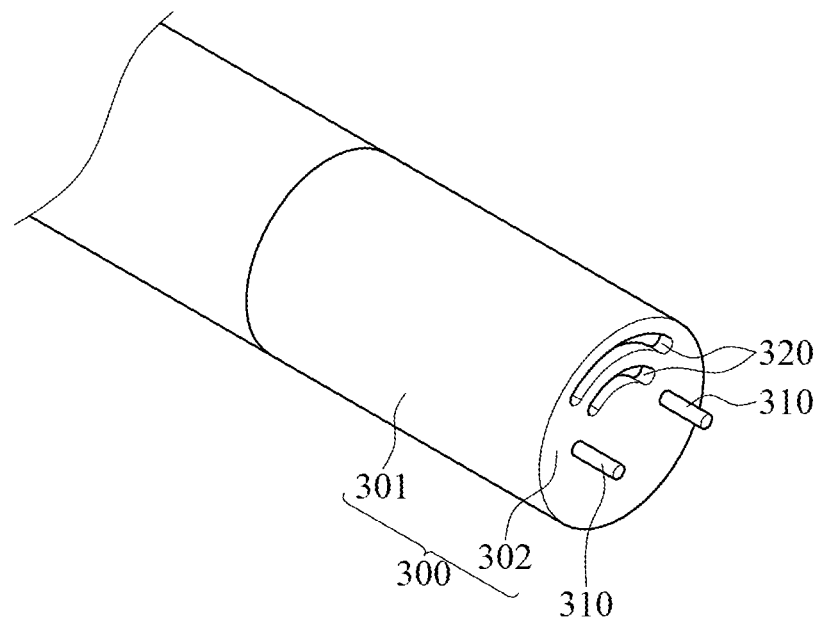

Referring to FIG. 9, the difference between the end caps 300 of FIG. 9 and FIG. 7 is the amount and forms of the openings 320. In the embodiment, there are two openings 320 shown in FIG. 9, and the two openings 320 are adjacent to each other. Under the circumstances that the interval between the two long edges of either opening 320 shown in FIG. 9 is substantially equal to that of the opening 320 shown in FIG. 7, the sum of the bore areas of the two adjacent openings 320 shown in FIG. 9 is greater than the bore area of the single opening 320 shown in FIG. 7. The two adjacent openings 320 shown in FIG. 9 are not only beneficial to convection but also beneficial to prevent most of the dust from passing through the opening 320 and entering the end cap 300.

Figure 10:
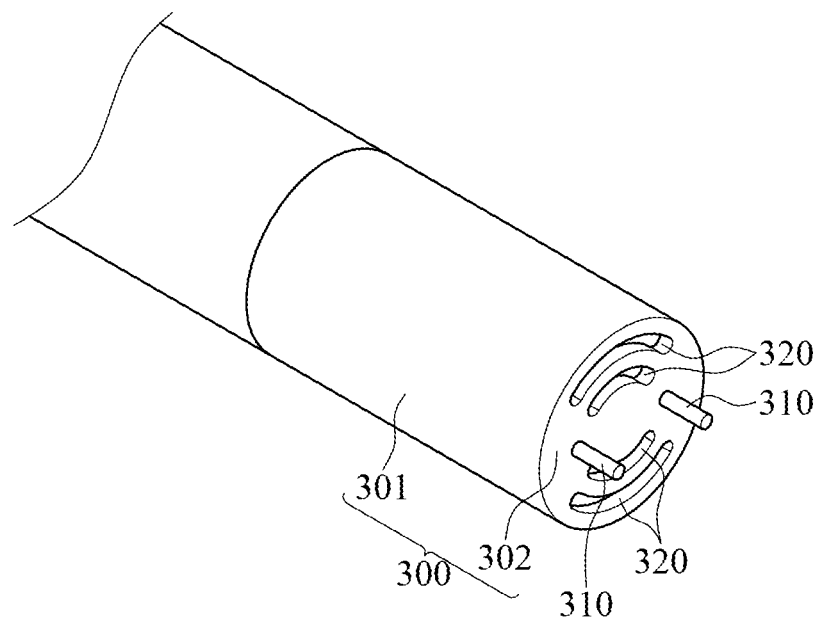

Referring to FIG. 10, the difference between the end caps 300 of FIG. 10 and FIG. 9 is the amount and forms of the openings 320. In the embodiment, there are two set of two openings 320 shown in FIG. 10, and the two set of two openings 320 are symmetrical to each other. The two set of two openings 320 shown in FIG. 10 are not only beneficial to convection of heated air and cool air but also beneficial to prevent dust from passing through the opening 320 and entering the end cap 300.

Figure 11:
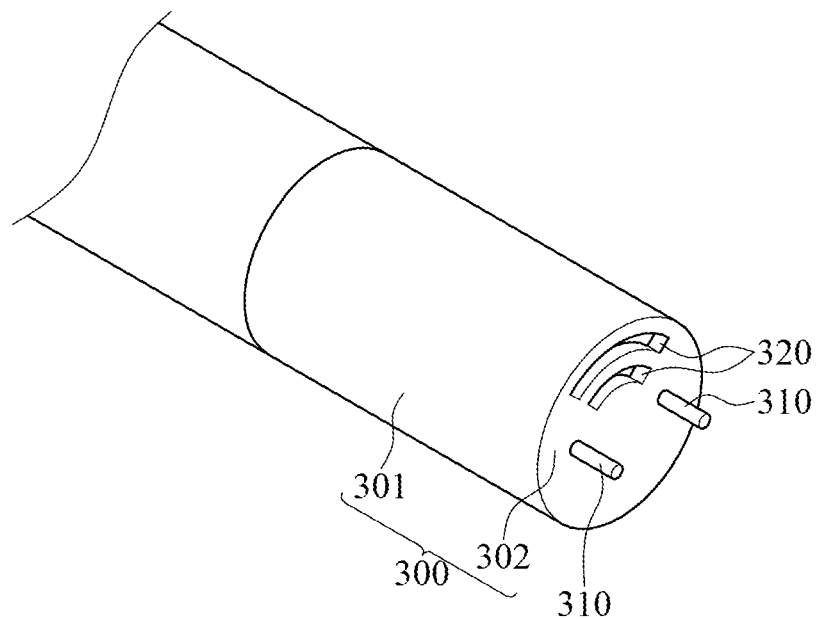
Figure 12:
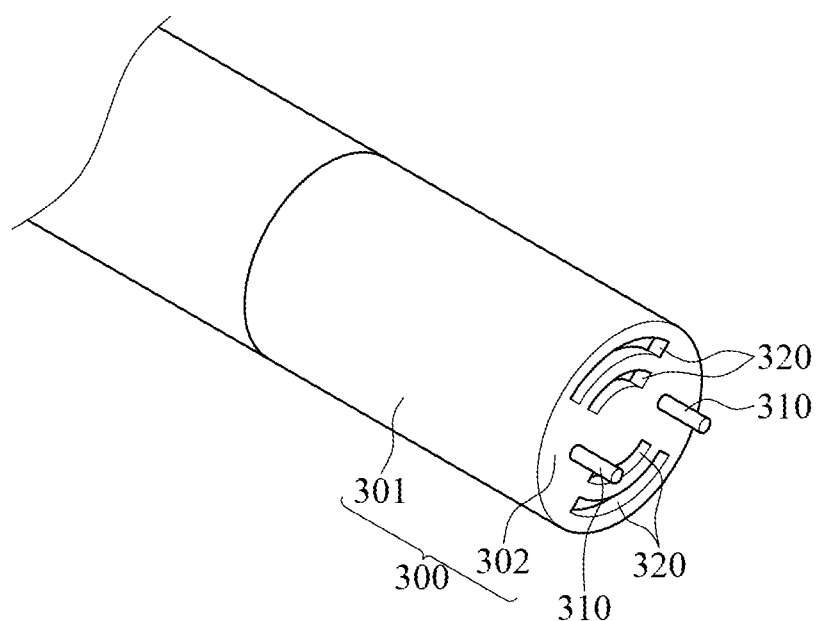

Referring to FIG. 11, the difference between the end caps 300 of FIG. 11 and FIG. 9 is the forms of the openings 320. The two short edges opposite to each other of each opening 320 shown in FIG. 9 are round. In the embodiment, the two short edges opposite to each other of each opening 320 shown in FIG. 11 are rectangular. Referring to FIG. 12, the difference between the end caps 300 of FIG. 12 and FIG. 10 is the forms of the openings 320. The two short edges opposite to each other of each opening 320 shown in FIG. 10 are round. In the embodiment, the two short edges opposite to each other of each opening 320 shown in FIG. 12 are rectangular. In different embodiments, the opening 320 can be a long, narrow and straight shaped opening.

Figure 13:
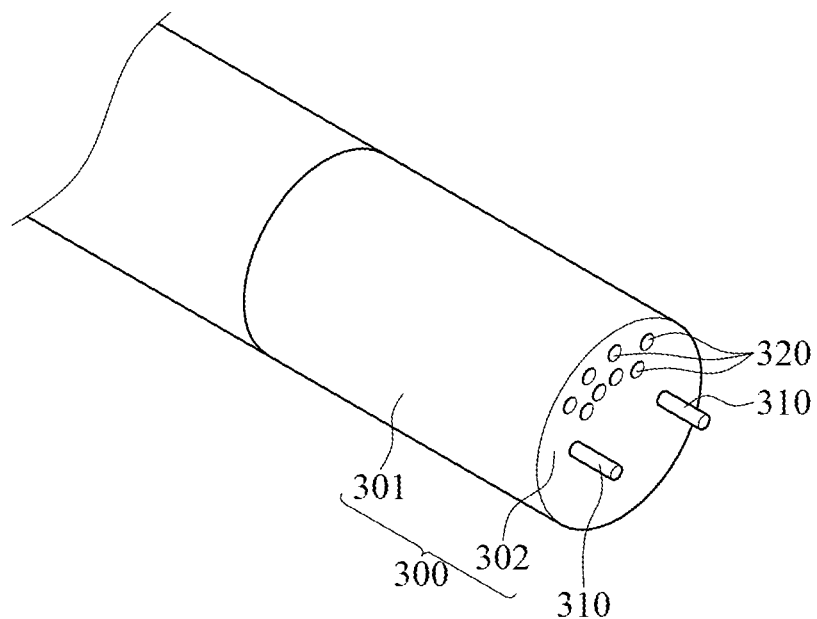

Referring to FIG. 13, the difference between the end caps 300 of FIG. 13 and FIG. 3 is the amount and forms of the openings 320. In the embodiment, the end cap 300 shown in FIG. 13 comprises several openings 320. The openings 320 are a plurality of circular shaped openings and are asymmetrically arranged on the end wall 302. Referring to FIG. 3 and FIG. 13, when the LED tube lamp 50 is installed to the horizontal lamp base, the axial directions of the tube 100 and the end cap 300 are substantially parallel with the horizontal direction "H", and the altitude of at least one of the openings 320 shown in FIG. 13 is higher than that of the axle of the tube 100 and the end cap 300 in the vertical direction "V". In the embodiment, the altitudes of all of the openings 320 shown in FIG. 13 are higher than that of the axle of the tube 100 and the end cap 300 in the vertical direction "V". In different embodiments, the openings 320 symmetrically arranged on the end wall 302 have different shapes, e.g., a long, circular shape. Moreover, at least a part of at least one of the openings 320 is higher than the axle of the tube 100 and the end cap 300 in the vertical direction "V".

Figure 14:
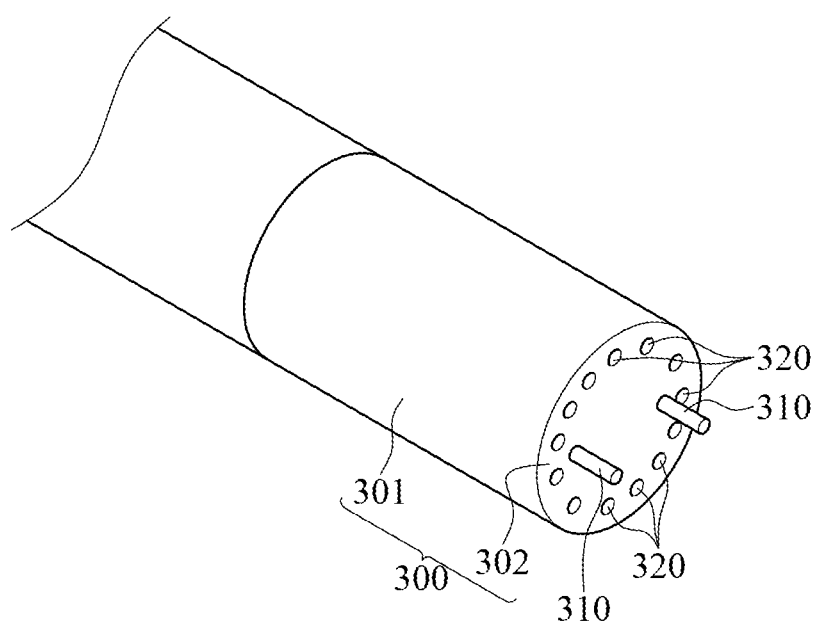

Referring to FIG. 14, the difference between the end caps 300 of FIG. 14 and FIG. 13 is the amount, arrangement, and forms of the openings 320. In the embodiment, the end cap 300 shown in FIG. 14 comprises several openings 320, and the openings 320 relative to the axle of the end cap 300 are symmetrical. The openings 320 are arranged on the end wall 302 and are around the axle of the end cap 300 in point symmetry.

Figure 15:
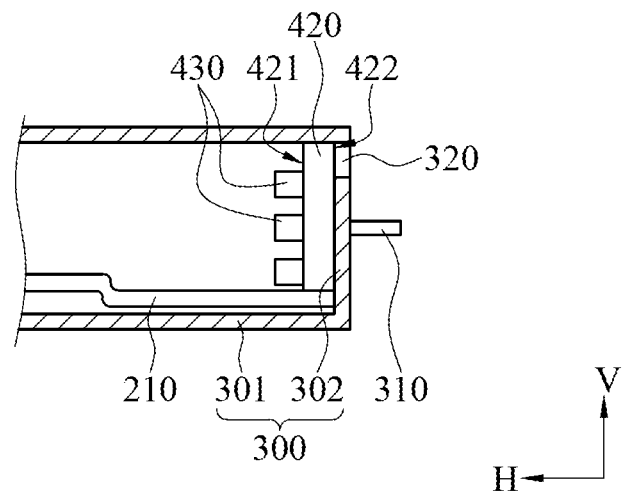
FIGS. 15 to 18 illustrate a part of cross sections of LED tube lamps according to several embodiments of the instant disclosure.

Referring to FIG. 15, the differences between the LED tube lamps 50 of FIG. 15 and FIG. 4 are the forms of the power supply 400 and the opening 320. The power supply 400 shown in FIG. 15 comprises a printed circuit board 420 and one or more electronic components 430. The printed circuit board 420 comprises a first surface 421 and a second surface 422 opposite to and substantially parallel with each other. The first surface 421 and the second surface 422 of the printed circuit board 420 are perpendicular to the axial direction of the lateral wall 301. The second surface 422 of the printed circuit board 420 relative to the first surface 421 is closer to the end wall 302 of the end cap 300 which at least part of the power supply 400 is inside. The electronic components 430 are disposed on the first surface 421 of the printed circuit board 420. The electronic components 430 can be, for example, capacitors.

In the embodiment, as shown in FIG. 15, the second surface 422 of the printed circuit board 420 contacts the inner surface of the end wall 302. Moreover, the metal wires 410 (not shown in FIG. 15) of the power supply 400 can be directly inserted in the hollow conductive pins 310 from the printed circuit board 420. Alternatively, the hollow conductive pins 310 can be directly contacted by a pair of corresponding contacts (not shown) on the second surface 422 of the printed circuit board 420. In addition, the freely extending end portion 210 is connected to the first surface 421 of the printed circuit board 420. In different embodiments, the second surface 422 of the printed circuit board 420 does not contact the inner surface of the end wall 302 and instead the second surface 422 of the printed circuit board 420 is spaced from the inner surface of the end wall 302 by a predetermined interval. The interval between the printed circuit board 420 and the end wall 302 is beneficial to convection of air. In addition, the freely extending end portion 210 is connected to the second surface 422 of the printed circuit board 420 (not shown).

In the embodiment, as shown in FIG. 15, the second surface 422 of the printed circuit board 420 fully contacts the inner surface of the end wall 302 and covers the opening 320; therefore, heat generated by the printed circuit board 420 can be directly transferred to cool air outside the end cap 300 through the opening 320 and, consequently, the effect of heat dissipation is well. Furthermore, under the circumstances that the second surface 422 of the printed circuit board 420 fully covers the opening 320, dust is blocked by the printed circuit board 420 so that dust won't pass through the opening 320 to enter the inner space of the end cap 300. Thus, the bore area of the opening 320 shown in FIG. 15 can be greater than that of the opening 320 shown in FIG. 4.

In different embodiments, the second surface 422 of the printed circuit board 420 contacts the inner surface of the end wall 302 while the end cap 300 has no opening 320. In the situation, the end wall 302 can comprise a material with high thermal conductivity. The end wall 302, for example, can be made by composite materials. The part of the end wall 320 which is connected to the hollow conductive pins 310 is made by an insulating material, and the other part of the end wall 320 is made by aluminum. Heat generated by the printed circuit board 420 can be directly transferred to the part of aluminum of the end wall 302 and then can be transferred to cool air outside the end cap 300 through the part of Aluminum; therefore, the effect of heat dissipation is well. In different embodiments, the opening 320 can be disposed on the lateral wall 301 such that when the LED tube lamp 50 is installed to the horizontal lamp base, the altitude of the opening 320 on the lateral wall 301 is higher than that of the axle of the tube 100 and the end cap 300 in the vertical direction "V".

Figure 16:
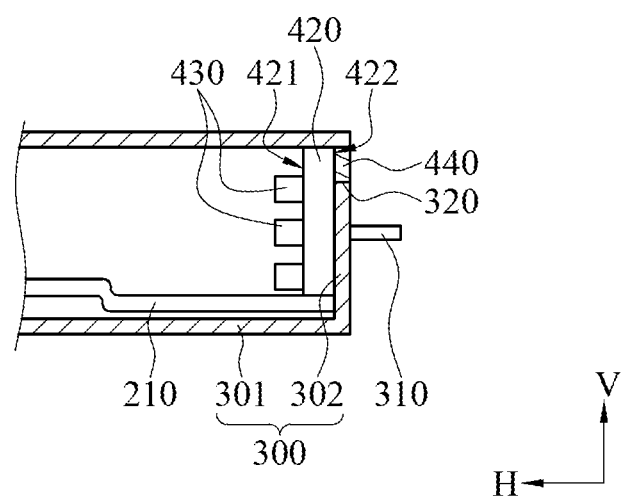

Referring to FIG. 16, the difference between the LED tube lamps 50 of FIG. 16 and FIG. 15 is that the power supply 400 shown in FIG. 16 further comprises a heat-dissipating element or a driving module 440. The heat-dissipating element or driving module 440 is disposed on the second surface 422 of the printed circuit board 420 and extends into the opening 320. In an embodiment, the heat-dissipating element 440a is a metal heat pipe or a metal fin. Heat generated by electronic components 430 on the printed circuit board 420 can be transferred to the heat-dissipating element 440a and then can be transferred to cool air outside the end cap 300 through the heat-dissipating element 440a; therefore, the effect of heat dissipation is well. Since the driving module 440b is a main heat source among the electronic components of the power supply 400, the idea of separation of the general electronic components 430 (the general electronic components 430 generating less heat than the driving module 440b) and the driving module 440b is beneficial to improve the effect of heat dissipation. For example, the general electronic components 430 are disposed on the first surface 421 of the printed circuit board 420 and the driving module 440b generating significant heat is disposed on the second surface 422 of the printed circuit board 420 and locates adjacently to the at least one opening 320. The heat-dissipating element or driving module 440 can be disposed in the opening 320 such that the heat generated by the driving module 440b or the heat of heat-dissipating element can be directly transferred to cool air outside the end cap 300; therefore, the effect of heat dissipation is improved. The driving module 440b comprises one or more specific electronic components generating significant heat including an inductor, a transistor, a resistor, or an integrated circuit. The arrangement of having the inductor, the transistor, the resistor, or the integrated circuit positioned in the opening 320 is beneficial to improve the effect of heat dissipation.

In different embodiments, several heat-dissipating elements or driving modules 440 of the power supply 400 can be respectively disposed in several openings 320. For example, the inductor, the transistor, and the integrated circuit can be respectively disposed in different openings 320. Alternatively, the heat-dissipating element, the inductor, the transistor, and the integrated circuit can be respectively disposed in different openings 320.

Figure 17:
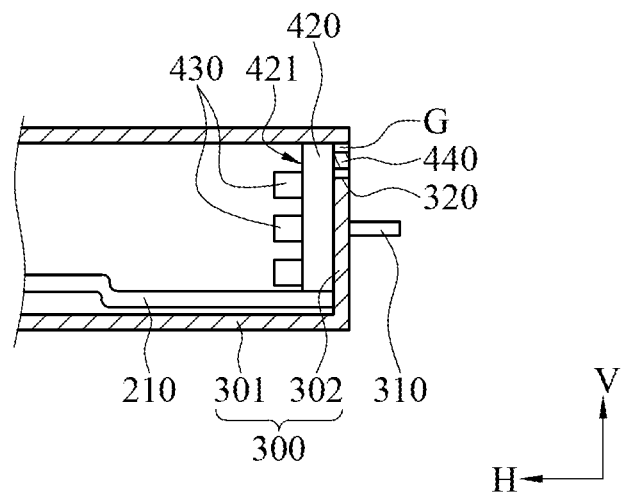

Referring to FIG. 16 and FIG. 17, the difference between FIG. 16 and FIG. 17 is whether the heat-dissipating element or driving module 440 and the opening 320 are sealed in the radial direction of the opening 320. The heat-dissipating element or driving module 440 (the heat-dissipating element 440a in the example) and the opening 320 shown in FIG. 16 are sealed, which means that the shape and the size of the cross section of the heat-dissipating element or driving module 440 in the radial direction exactly match the shape and the size of the bore of the opening 320 in the radial direction. In one embodiment, at least one component of the heat-dissipating element or the driving module 440 and the at least one opening 320 are substantially sealed in the radial direction of the at least one opening. Instead, there is a gap "G" between the heat-dissipating element or driving module 440 (the driving module 440b in the example) and the opening 320 in the radial direction shown in FIG. 17. Thus the outside air can freely flow through the gap "G" to enter the end cap 300 while the heat-dissipating element or driving module 440 is in the opening 320. The effect that the heat-dissipating element or driving module 440 and the opening 320 are sealed in the radial direction is not the same as the effect of air tight. There may be small gaps hard to be seen by eyes but still exist between the heat-dissipating element or driving module 440 and the opening 320 shown in FIG. 16. However, the small gaps between the heat-dissipating element or driving module 440 and the opening 320 shown in FIG. 16 is much smaller than the gap "G" shown in FIG. 17 and, consequently, the heat-dissipating element or driving module 440 and the opening 320 shown in FIG. 16 block cool air outside the opening 320 to a great extent.

Figure 18:
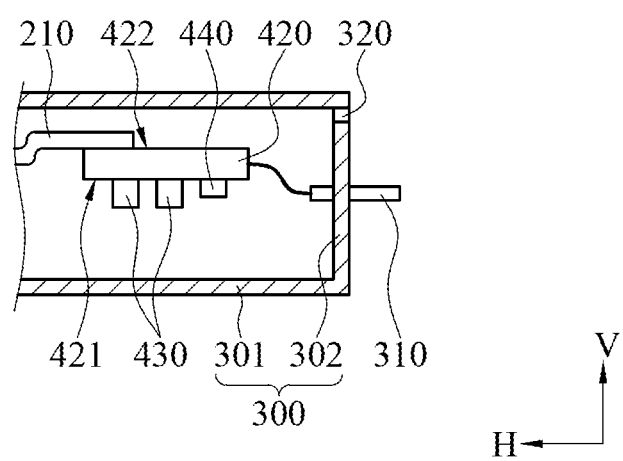

Referring to FIG. 18, the differences between the LED tube lamps 50 of FIG. 18 and FIG. 4 are the forms of the power supply 400. The power supply 400 shown in FIG. 18 comprises a printed circuit board 420, one or more electronic components 430, and a heat-dissipating element or driving module 440. The printed circuit board 420 comprises a first surface 421 and a second surface 422 opposite to and substantially parallel with each other. The first surface 421 and the second surface 422 of the printed circuit board 420 are substantially parallel with the axial direction of the lateral wall 301. The electronic components 430 and the heat-dissipating element or driving module 440 (the driving module 440b in the example) are all disposed on the first surface 421 of the printed circuit board 420. The heat-dissipating element or driving module 440 relative to the electronic components 430 is closer to the opening 320. In an embodiment, the heat-dissipating element 440a is a metal heat pipe or a metal fin. Heat generated by the printed circuit board 420 can be transferred to the heat-dissipating element 440a. Since the heat-dissipating element 440a relative to the electronic components 430 is closer to the opening 320, it is beneficial to heat exchange between the heat-dissipating element 440a and outside cool air, and, consequently, the effect of heat dissipation is better. In an embodiment, the driving module 440b relative to the electronic components 430 (the general electronic components generating less heat than the driving module 440b) is closer to the opening 320, which is beneficial to heat exchange between the driving module 440b and outside cool air. Thus the effect of heat dissipation is better. The driving module 440b comprises one or more specific electronic components generating significant heat. The specific electronic components includes include an inductor, a transistor, a resistor, or an integrated circuit. The arrangement that the inductor, the transistor, the resistor, or the integrated circuit relative to the general electronic components 430 is closer to the opening 320 is beneficial to improve the effect of heat dissipation.

Figure 19:
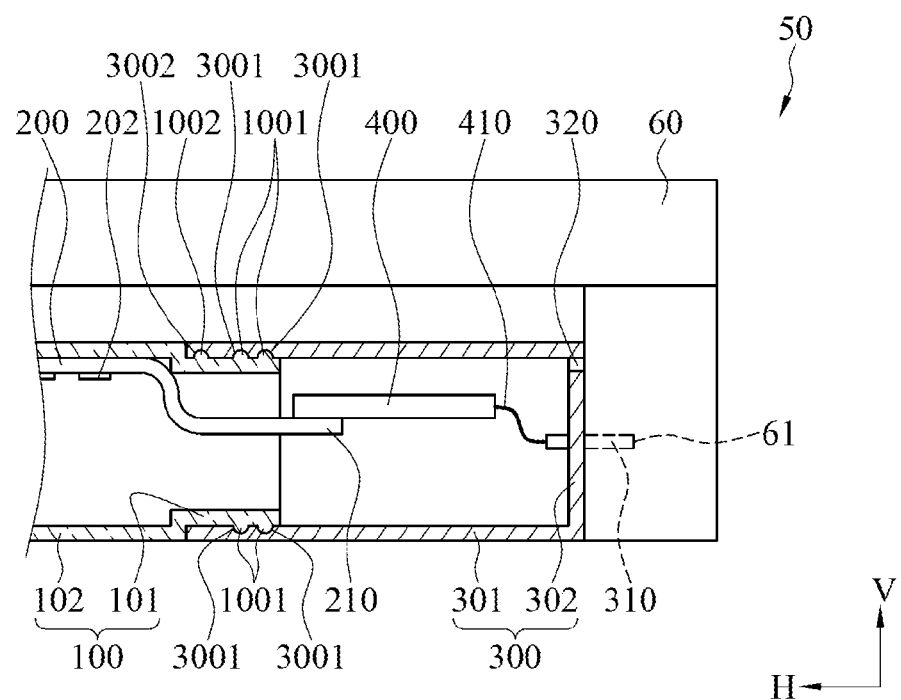
FIGS. 19 and 20 illustrate a part of cross sections of LED tube lamps installed to lamp bases according to several embodiments of the instant disclosure.

Referring to FIG. 19, FIG. 19 is a part of a cross section of the LED tube lamp 50 installed to a lamp base 60. The LED tube lamp 50 shown in FIG. 19 comprises a coupling structure. A part of the coupling structure is disposed on the rear end region 101 of the tube 100, and the other part of the coupling structure is disposed on the end cap 300. The tube 100 and the end cap 300 can be connected to each other by the coupling structure. The coupling structure comprises a first thread 3001 disposed on the lateral wall 301 and a second thread 1001 disposed on the rear end region 101 of the tube 100. The first thread 3001 is on the inner surface of the lateral wall 301 and is at an end of the lateral wall 301 away from the end wall 302. The second thread 1001 is on the outer surface of the rear end region 101 of the tube 100 and is close to the open end of the tube 100 (i.e., the two opposite ends of the tube 100). The first thread 3001 is corresponding to the second thread 1001. The end cap 300 can be connected to the tube 100 by relative rotation of the first thread 3001 and the second thread 1001. Based on the coupling structure, the end cap 300 can be easily assembled to the tube 100 or disassembled from the tube 100.

As shown in FIG. 19, in the embodiment, when the relative rotation of the first thread 3001 and the second thread 1001 is done and the first thread 3001 fully matches the second thread 1001 (i.e., the end cap 300 is properly assembled to the tube 100), the opening 320 is rotated about the axle of the tube 100 to a predetermined position. Specifically, while the lamp base 60 is horizontal or substantially horizontal and the LED tube lamp 50 is horizontally installed to the lamp base 60, the axial directions of the tube 100 and the end cap 300 are substantially parallel with the horizontal direction "H", and the predetermined position means that the altitude of the opening 320 is higher than that of the axle of the lateral wall 302 in the vertical direction "V" in the configuration.

As shown in FIG. 19, in the embodiment, the coupling structure further comprises a first positioning unit 3002 disposed on the lateral wall 301 and a second positioning unit 1002 disposed on the rear end region 101 of the tube 100. The first positioning unit 3002 is corresponding to the second positioning unit 1002. When the relative rotation of the first thread 3001 and the second thread 1001 is done and the first thread 3001 fully matches the second thread 1001, the first positioning unit 3002 mates the second positioning unit 1002, such that the tube 100 and the end cap 300 are positioned to each other. In the embodiment, the first positioning unit 3002 is a concave point on the inner surface of the lateral wall 301, and the second positioning unit 1002 is a convex point on the outer surface of the rear end region 101 of the tube 100. When the first thread 3001 fully matches the second thread 1001, the convex point of the second positioning unit 1002 falls in the concave point of the first positioning unit 3002 to assist the fixation of the LED tube lamp 50 and to inform people assembling the LED tube lamp 50 that the end cap 300 has been properly assembled to the tube 100. More particularly, when the first positioning unit 3002 and the second positioning unit 1002 are coupled to each other along with slightly sound and vibration, people assembling the LED tube lamp 50 can be informed by hearing the sound or feeling the vibration and can immediately realize that the end cap 300 has been properly assembled to the tube 100. In the assembling process of the LED tube lamp 50, operator, based on the sound and the vibration generated by the mating (coupling) of the first positioning unit 3002 and the second positioning unit 1002, can finish the assembling process of an assembled LED tube lamp 50 in time. Thus the efficiency of assembling can be improved.

In different embodiments, the first positioning unit 3002 can be a convex point, and the second positioning unit 1002 can be a concave point. In different embodiments, the first positioning unit 3002 and the second positioning unit 1002 can respectively be disposed on different positions of the end cap 300 and the rear end region 101 of the tube 100 on the premise that the first positioning unit 3002 mates the second positioning unit 1002 only when the end cap 300 is properly assembled to the tube 100.

As shown in FIG. 19, the method of having the LED tube lamp 50 installed to the lamp base 60 is: plugging the hollow conductive pins 310 of the end cap 300 into the conductive sockets 61 of the lamp base 60, and rotating the LED tube lamp 50 about the axle of the tube 100 and the end cap 300 until the hollow conductive pins 310 in the conductive sockets 61 are rotated to a predetermined position. The assembling is done when the hollow conductive pins 310 in the conductive sockets 61 are in the predetermined position.

In the embodiment, torque applied to the tube 100 and the end cap 300 to have the first thread 3001 and the second thread 1001 relatively rotated until the first thread 3001 fully matches the second thread 1001 is greater than that applied to the LED tube lamp 50 to have the LED tube lamp 50 installed to the lamp base 60 (i.e., torque for rotating the hollow conductive pins 310 in the conductive sockets 61). In other words, friction force between the first thread 3001 and the second thread 1001 of the assembled LED tube lamp 50 is greater than that between the hollow conductive pins 310 and the conductive sockets 61 when the LED tube lamp 50 is installed to the lamp base 60. In an embodiment, the friction force between the first thread 3001 and the second thread 1001 is at least twice greater than that between the hollow conductive pins 310 and the conductive sockets 61. When the installed LED tube lamp 50 is going to be uninstalled from the lamp base 60, the hollow conductive pins 310 in the conductive sockets 61 have to be reversely rotated to a predetermined position in advance, and then the LED tube lamp 50 can be unplugged from the lamp base 60 (i.e., the hollow conductive pins 310 can be unplugged from the conductive sockets 61). Since the friction force between the first thread 3001 and the second thread 1001 is greater than that between the hollow conductive pins 310 and the conductive sockets 61, the relative position of the first thread 3001 and the second thread 1001 remains still during the reverse rotation of the hollow conductive pins 310 in the conductive sockets 61. As a result, the end cap 300 won't accidentally loose from the tube 100 during the process of uninstalling the LED tube lamp 50 from the lamp base 60.

Figure 20:
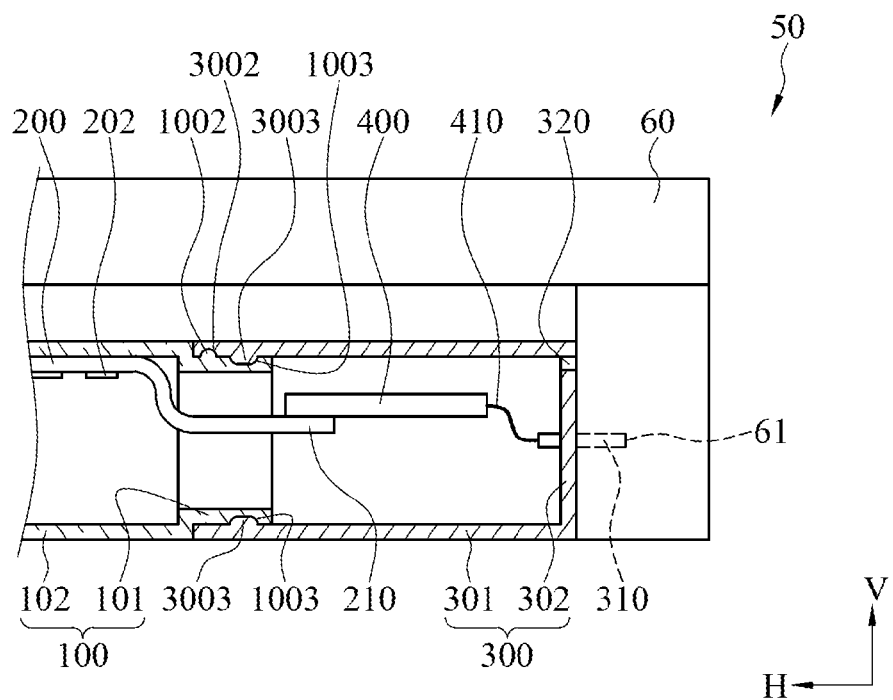

Referring to FIG. 20, FIG. 20 is a part of a cross section of the LED tube lamp 50 installed to the lamp base 60, the difference between the LED tube lamps 50 of the FIG. 20 and FIG. 19 is with respect to the coupling structures. As shown in FIG. 20, the coupling structure comprises an annular convex portion 3003 disposed on the lateral wall 301 and an annular trough 1003 disposed on the rear end region 101 of the tube 100. The annular convex portion 3003 is on the inner surface of the lateral wall 301 and is at an end of the lateral wall 301 away from the end wall 302. The annular trough 1003 is on the outer surface of the rear end region 101 of the tube 100. The annular convex portion 3003 is corresponding to the annular trough 1003. The end cap 300 can be connected to the tube 100 by the coupling of the annular convex portion 3003 and the annular trough 1003. The annular convex portion 3003 and the annular trough 1003 are rotatably connected to each other. More particularly, the annular convex portion 3003 is capable of sliding along the annular trough 1003, and, consequently, the tube 100 and the end cap 300 have a degree of freedom capable of rotating relative to each other about the axle of the tube 100 and the end cap 300 by the annular convex portion 3003 and the annular trough 1003.

As shown in FIG. 20, in the embodiment, the coupling structure further comprises a first positioning unit 3002 disposed on the lateral wall 301 and a second positioning unit 1002 disposed on the rear end region 101 of the tube 100. The structure and the function of the first positioning unit 3002 and the second positioning unit 1002 are described above and there is no need to repeat. Although the tube 100 and the end cap 300 are rotatably connected to each other by the coupling of the annular convex portion 3003 and the annular trough 1003, the first positioning unit 3002 mates the second positioning unit 1002 (e.g., the concave point of the first positioning unit 3002 and the convex point of the second positioning unit 1002 are coupled to each other) when the tube 100 and the end cap 300 are rotated relative to each other to a predetermined position to assist the positioning in the assembling process of the tube 100 and the end cap 300 and to enhance the fixation of the tube 100 and the end cap 300. Based on the coupling structure, the end cap 300 can be easily assembled to the tube 100 or disassembled from the tube 100.

As shown in FIG. 20, in the embodiment, the rear end regions 101 of the tube 100 utilized for being connected to the end cap 300 is shrunk in the radial direction. The extent that the rear end regions 101 shrunk (i.e., difference between the main body region 102 and the rear end regions 101 in radial direction) is equivalent to the thickness of the lateral wall 301 of the end cap 300. Thus the outer surface of the lateral wall 301 of the end cap 300 is aligned with the outer surface of the main body region 102 of the tube 100 while the end cap 300 and the tube 100 are connected to each other.

In different embodiments, the annular trough 1003 can be disposed on the lateral wall 301, and the annular convex portion 3003 can be disposed on the rear end region 101 of the tube 100. Additionally, the coupling structure can further comprise a hot melt adhesive. The hot melt adhesive can be disposed in the joint of the tube 100 and the end cap 300 (e.g., between the rear end region 101 and the lateral wall 301). When assembling the tube 100 and the end cap 300, the end cap 300 can be assembled to the tube 100 via the coupling structure in advance, and the hot melt adhesive is in liquid state in the assembling process. After heating up the hot melt adhesive, and upon expansion due to heat absorption, the hot melt adhesive flows, and then solidifies upon cooling, thereby bonding together the end cap 300 to the tube 100 (not shown). The volume of the hot melt adhesive may expand to about 1.3 times the original size when heated from room temperature (e.g., between about 15 and 30 degrees Celsius) to about 200 to 250 degrees Celsius. The end cap 300 and the end of the tube 100 could be secured by using the hot melt adhesive and therefore qualified in a torque test of about 1.5 to about 5 newton-meters (Nt-m) and/or in a bending test of about 5 to about 10 newton-meters (Nt-m). During the heating and solidification of the hot melt adhesive, the heat and pressure inside the end cap increase and are then released through the at least one opening 320 on the end cap 300. After the hot melt adhesive hardens, the end cap 300 can be firmly fixed to the tube 100. Under the circumstances, the end cap 300 and the tube 100 is hard to disassemble unless the hardened hot melt adhesive returns to liquid state by certain process. The design of the LED tube lamp 50 is to take into account both the convenience regarding the assembling process of the LED tube lamp 50 and the robustness regarding the assembled LED tube lamp 50.

Figure 21:
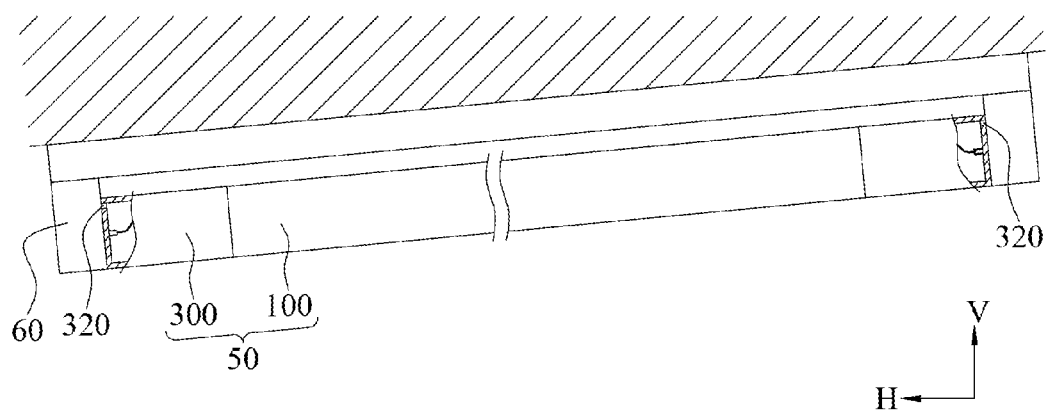
FIG. 21 illustrates a perspective view of an LED tube lamp installed to a lamp base according to an embodiment of the instant disclosure.

Referring to FIG. 21, FIG. 21 is a perspective view of the LED tube lamp 50 installed to an inclined lamp base 60. In different embodiments, the LED tube lamp 50 can be installed to an inclined or a vertical lamp base 60 in an inclined or vertical pose. In the embodiment, as shown in FIG. 21, the lamp base 60 is inclined. Thus the axle of the LED tube lamp 50 and the horizontal direction "H" define an acute angle while the LED tube lamp 50 is installed to the lamp base 60. Under the circumstances that the LED tube lamp 50 installed to the lamp base 60 is inclined, the altitude of the opening 320 of the end cap 300 is still higher than that of the axle of the LED tube lamp 50 in the vertical direction "V", which is beneficial to improve the effect of heat dissipation.

Figure 22:
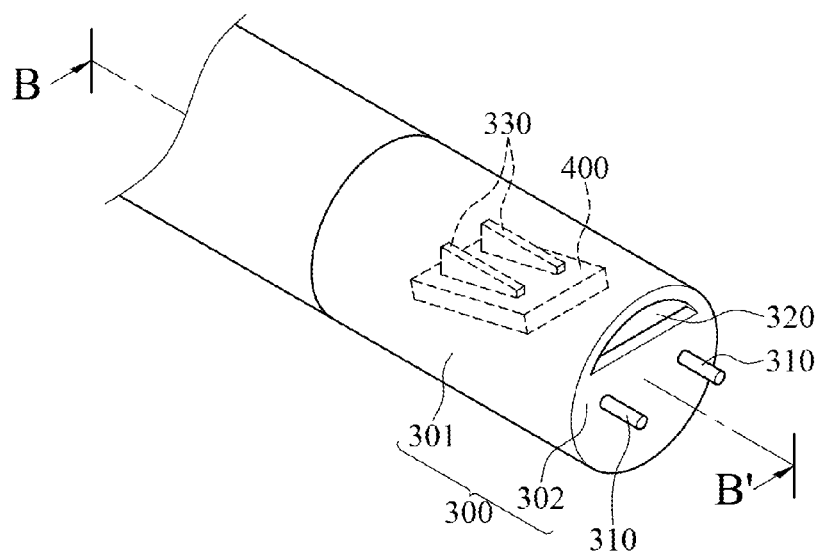
FIG. 22 illustrates a partial view of an LED tube lamp according to an embodiment of the instant disclosure.
Figure 23:
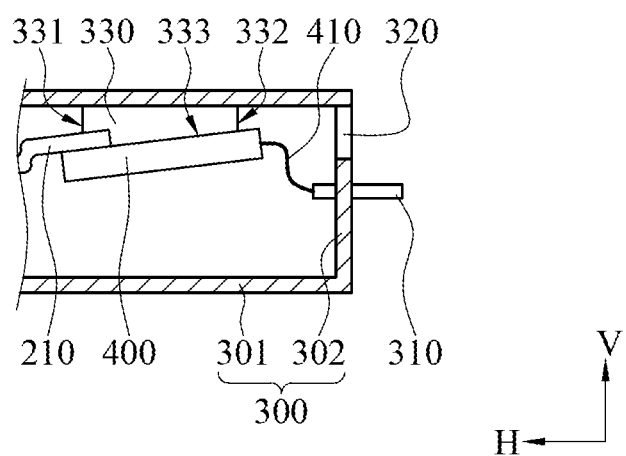
FIG. 23 illustrates a part of a cross section of FIG. 22 along the line B-B'.
Figure 24:
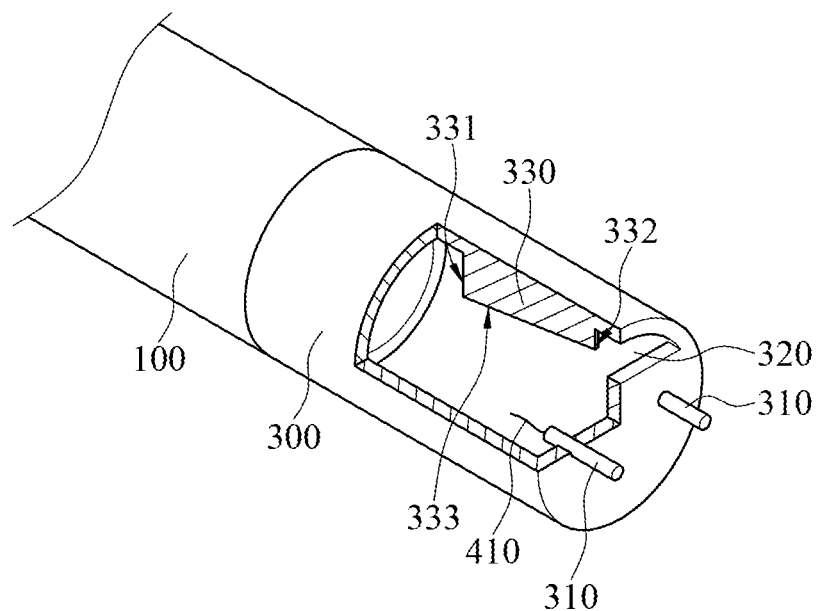
FIG. 24 illustrates a partially steric cross section of FIG. 22.

Referring to FIGS. 22, 23 and 24, FIG. 22 is a partial view of the LED tube lamp 50, FIG. 23 is a cross section of FIG. 22 along the line B-B', and FIG. 24 is a partially cross section of FIG. 22. Wherein a part of components of the end cap 300 is not shown in FIG. 24. The difference between the end cap 300 of FIGS. 22 to 24 and the end cap 300 of FIG. 3 is the forms of the openings 320. Additionally, the end cap 300 of FIGS. 22 to 24 further comprises two vertical ribs 330, and the vertical ribs 330 are utilized for fixation of the printed circuit board 420 of the power supply 400. Thus the relative position between the printed circuit board 420 of the power supply 400 and the end cap 300 of FIGS. 22 to 24 can be varied based on the shape of the vertical ribs 300.

As shown in FIG. 22, in the embodiment, the opening 320 has a bow-shaped opening. The size and the position of the opening 320 are corresponding to the two vertical ribs 330. That is to say, the two vertical ribs can be seen from outside the opening 320 in the viewing angle which is substantially parallel with and is along the axial direction of the end cap 300. Furthermore, the two vertical ribs 330 are disposed on the inner surface of the lateral wall 301, and the two vertical ribs are spaced from each other and extend along the axial direction of the lateral wall 301. The vertical ribs 330 are perpendicular to a plane at which the printed circuit board 420 of the power supply 400 is located. In other words, the two vertical ribs 330 are perpendicular to a side of the printed circuit board 420 of the power supply 400 in the radial direction of the end cap 300. For illustration, as shown in FIG. 23, when the LED tube lamp 50 is horizontally installed, the axial directions of the end cap 300 is substantially parallel with the horizontal direction "H", and the vertical ribs 300 extend from the inner surface of the lateral wall 301 along the vertical direction "V" and is connected to the printed circuit board 420 of the power supply 400.

As shown in FIG. 23 and FIG. 24, the vertical rib 330 comprises a first side 331, a second side 332, and a third side 333. The first side 331 and the second side 332 are opposite to each other. The second side 332 relative to the first side 331 is closer to the opening 320. The third side 333 is away from the lateral wall 301 and is between the first side 331 and the second side 332. The third side 333 is connected to the printed circuit board 420 of the power supply 400. The third side 333 is, but is not limited to, adhered to or coupled to the printed circuit board 420 of the power supply 400.

In the embodiment, as shown in FIGS. 22 to 24, the shortest distance between the third side 333 of the vertical rib 330 and the lateral wall 301 gradually decreases along the axial direction of the lateral wall 301 towards the end wall 302. For illustration, as shown in FIG. 23, the height of any point of the vertical rib 330 along the horizontal direction "H" relative to the lateral wall 301 in the vertical direction "V" is the shortest distance between the third side 333 of the vertical rib 330 and the lateral wall 301. The height of the vertical rib 330 gradually decreases along the axial direction of the lateral wall 301 towards the end wall 302. That is to say, the height of the vertical rib 330 relative to the lateral wall 301 gradually decreases from the first side 331 to the second side 332. Thus an extending direction of the third side 333 and the axial direction of the end cap 300 define an acute angle, and, consequently, the printed circuit board 420 of the power supply 400 connected to the third side 333 is inclined. For illustration, as shown in FIG. 23, the altitude of one side of the printed circuit board 420 of the power supply 400 close to the end wall 302 is different from that of the other side of the printed circuit board 420 of the power supply 400 away from the end wall 302 in the vertical direction "V". The altitude of the side of the printed circuit board 420 of the power supply 400 close to the end wall 302 is higher than that of the other side of the printed circuit board 420 of the power supply 400 away from the end wall 302. The side of the printed circuit board 420 of the power supply 400 close to the end wall 302 relative to the other side of the printed circuit board 420 of the power supply 400 is closer to the opening 320. Under the circumstances, heated air generated by the power supply 400 can rise along the inclined power supply 400 and flow through the opening 320 to outside area of the end cap 300, which is beneficial to improve the effect of heat dissipation.

Figure 25:
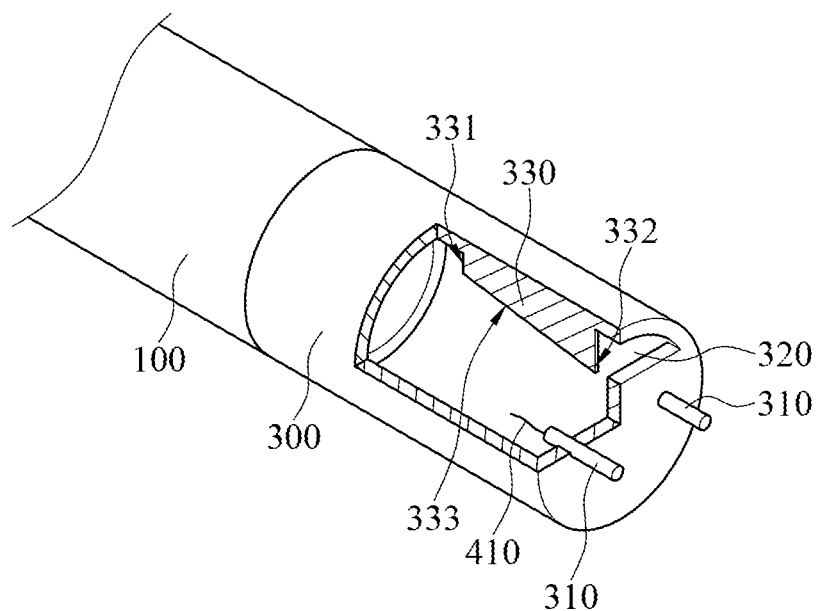
FIG. 25 illustrates a partially steric cross section of an LED tube lamp according to an embodiment of the instant disclosure.

Referring to FIG. 25, the difference between the end cap 300 of FIG. 25 and the end cap 300 of FIGS. 22 to 24 is the forms of the vertical ribs 330. The shortest distance between the third side 333 of the vertical rib 330 shown in FIG. 25 and the lateral wall 301 gradually increases along the axial direction of the lateral wall 301 towards the end wall 302. That is to say, the height of the vertical rib 330 relative to the lateral wall 301 gradually increases from the first side 331 to the second side 332. Under the circumstances, the altitude of one side of the printed circuit board 420 of the power supply 400 connected to the third side 333 of the vertical rib 330 close to the end wall 302 is lower than that of the other side of the printed circuit board 420 of the power supply 400 away from the end wall 302. The configuration of the vertical ribs 330 and the printed circuit board 420 of the power supply 400 shown in FIG. 25 is beneficial to convection of inside heated air and outside cool air since outside cool air can easily enter the inner space of the end cap 300.

Figure 26:
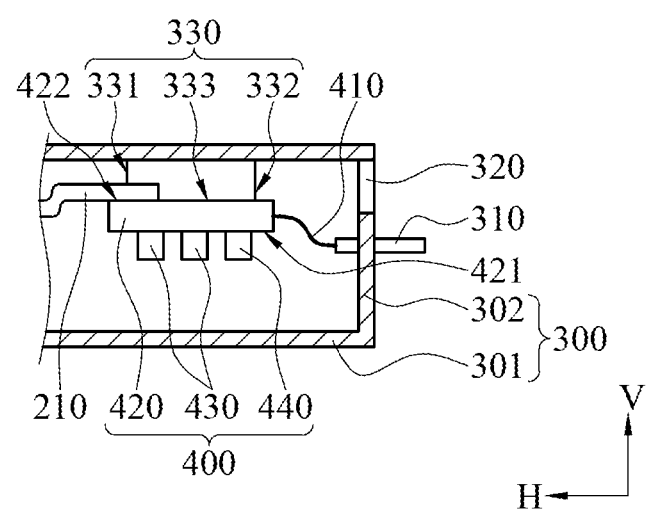
FIG. 26 illustrates a part of a cross section of an LED tube lamp according to an embodiment of the instant disclosure.

Referring to FIG. 26, the difference between the end cap 300 of FIG. 26 and the end cap 300 of FIGS. 22 to 24 is the forms of the vertical ribs 330. In addition, the power supply 400 shown in FIG. 26 further comprises a printed circuit board 420. In different embodiments, the power supply 400 can further comprise a power module disposed on the printed circuit board 420 or can further comprise one or more electronic components 430 and one or more heat-dissipating elements or driving modules 440 disposed on the printed circuit board 420. In different embodiments, the power supply 400 can be a module, e.g., an integrated power module integrated with the printed circuit board 420 and electronic components.

As shown in FIG. 26, in the embodiment, the power supply 400 further comprises electronic components 430 and a heat-dissipating element or driving module 440 disposed on the printed circuit board 420. Specifically, the printed circuit board 420 comprises a first surface 421 and a second surface 422 opposite to each other. The electronic components 430 and the heat-dissipating element or driving module 440 are disposed on the first surface 421. The second surface 422 is connected to the third sides 333 of the vertical ribs 330. In the embodiment, the height of the vertical rib 330 relative to the lateral wall 301 from the first side 331 to the second side 332 is identical, and, consequently, the printed circuit board 420 connected to the third side 333 is horizontal but not inclined. The heat-dissipating element or driving module 440 can be a heat-dissipating element, an inductor, a transistor, or an integrated circuit. The heat-dissipating element or driving module 440 relative to the electronic components 430 is closer to the opening 320. In addition, the second surface 422 of the printed circuit board 420 is spaced from the lateral wall 301 by a certain interval based on the vertical ribs 330. An extending direction of the vertical rib 330 from the first side 331 to the second side 332 is towards the opening 320. As a result, there is a space for convection of air between the power supply 400 and the lateral wall 301, and heated air can easily flow through the opening 320 to outside area of the end cap 300.

Figure 27:
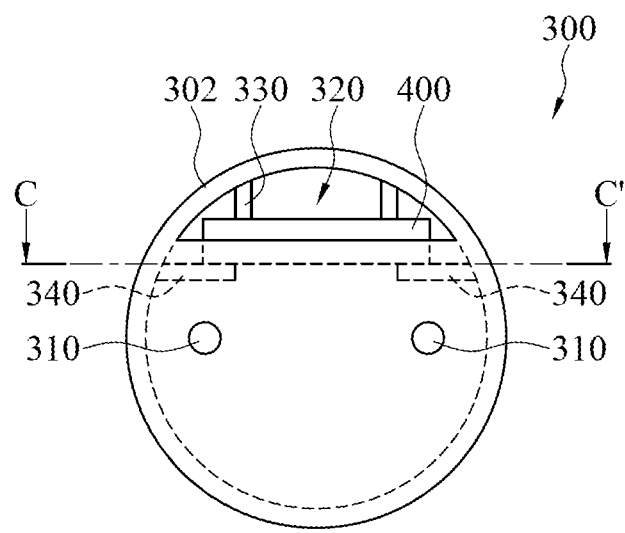
FIG. 27 illustrates an end view of an LED tube lamp in which the viewing angle is substantially parallel with an axle of an end cap according to an embodiment of the instant disclosure.
Figure 28:
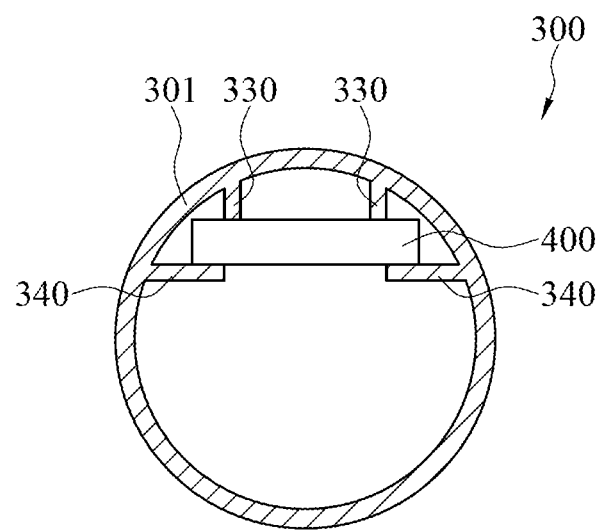
FIG. 28 illustrates a radial cross section of an end cap of FIG. 27.
Figure 29:
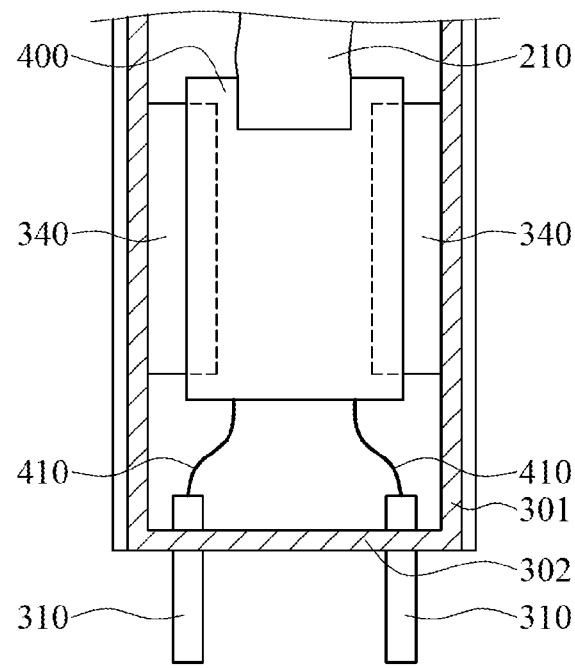
FIG. 29 illustrates a part of an axial cross section of FIG. 27 along the line C-C'.

Referring to FIGS. 27 to 29, FIG. 27 is an end view of the LED tube lamp 50 in which the viewing angle is substantially parallel with the axle of the end cap 300, FIG. 28 is a radial cross section of the end cap 300 of FIG. 27, and FIG. 29 is a part of an axial cross section of FIG. 27 along the line C-C'. The difference between the end caps 300 between FIGS. 27 to 29 and FIG. 26 is that the end cap 300 shown in FIGS. 27 to 29 further comprises two horizontal ribs 340, and the power supply 400 shown in FIGS. 27 to 29 is a power module.

The opening 320 is the bow-shaped opening, as described above. The size and the position of the opening 320 are corresponding to the two vertical ribs 330. More particularly, a projection of the two vertical ribs 330 is inside a projection of the opening 320 on a plane of projection perpendicular to the axial direction of the end cap 300. In other words, as shown in FIG. 27, the two vertical ribs can be seen from outside the opening 320 when seeing into the opening 320 along the axial direction of the end cap 300. As a result, the space for convection between the two vertical ribs 330 and power supply 400 is corresponding to the opening 320 which is beneficial to improve the effect of heat dissipation.

In the embodiment, as shown in FIGS. 27 to 29, the two horizontal ribs 340 are disposed on the inner surface of the lateral wall 301, and the two horizontal ribs 340 are spaced from each other and extend along the axial direction of the lateral wall 301. Each of the horizontal ribs 340 has a long and flat shape. The two horizontal ribs 340 are opposite to each other and are symmetric. The two horizontal ribs 340 are respectively corresponding to the two vertical ribs 330.

The printed circuit board 420 of the power supply 400 is sandwiched between the vertical ribs 330 and the horizontal ribs 340. In other words, one side of the printed circuit board 420 of the power supply 400 is connected to the vertical ribs 330, and the other side of the printed circuit board 420 of the power supply 400 is connected to the horizontal ribs 340. The collaboration of the vertical ribs 330 and the horizontal ribs 340 can firmly clamp and fix the printed circuit board 420 of the power supply 400.

Figure 30:
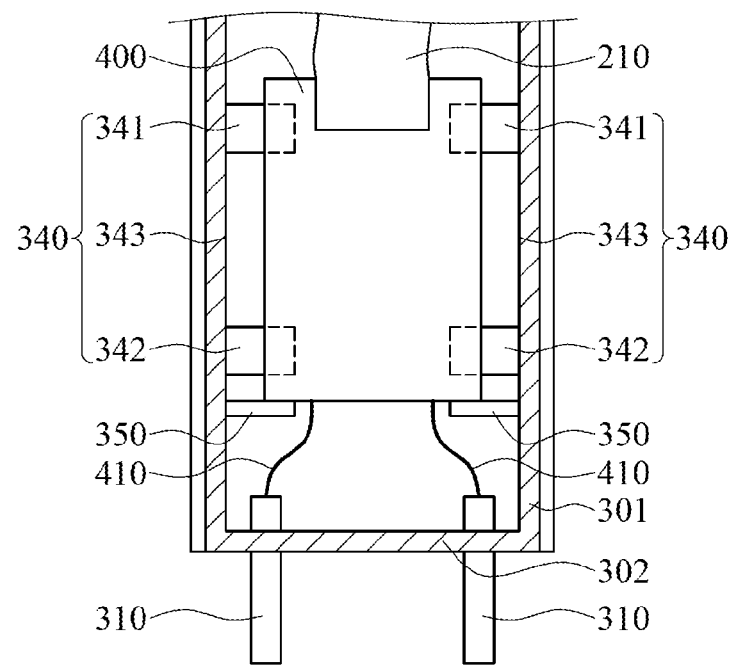
FIGS. 30 and 31 illustrate a part of axial cross sections of LED tube lamps according to several embodiments of the instant disclosure.

Referring to FIG. 30, the difference between the end caps 300 of FIG. 30 and FIG. 29 is that the horizontal rib 340 shown in FIG. 29 is a whole piece and instead, the horizontal rib 340 shown in FIG. 30 has a cut portion. More particularly, the horizontal rib 340 shown in FIG. 30 comprises a first rib portion 341, a second rib portion 342, and a cut portion 343. The cut portion 343 is between the first rib portion 341 and the second rib portion 342. That is to say, the first rib portion 341 and the second rib portion 342 are spaced from each other by the cut portion 343. The cut portion 343 can be utilized for convection of air and is beneficial to improve the effect of heat dissipation.

In addition, the difference between the end caps 300 of FIG. 30 and FIG. 29 is that the end cap 300 shown in FIG. 30 further comprises a blocking plate 350. The blocking plate 350 is disposed on the inner surface of the lateral wall 301. The blocking plate 350 and the end wall 302 are spaced from each other in the axial direction of the lateral wall 301. A side of the printed circuit board 420 of the power supply 400 facing towards the end wall 302 contacts the blocking plate 350. The printed circuit board 420 of the power supply 400 is spaced from the end wall 302 by the blocking plate 350 such that there is a gap between the printed circuit board 420 of the power supply 400 and the end wall 302 in the axial direction of the lateral wall 301. The gap can be utilized for convection of air and is beneficial to improve the effect of heat dissipation.

Figure 31:
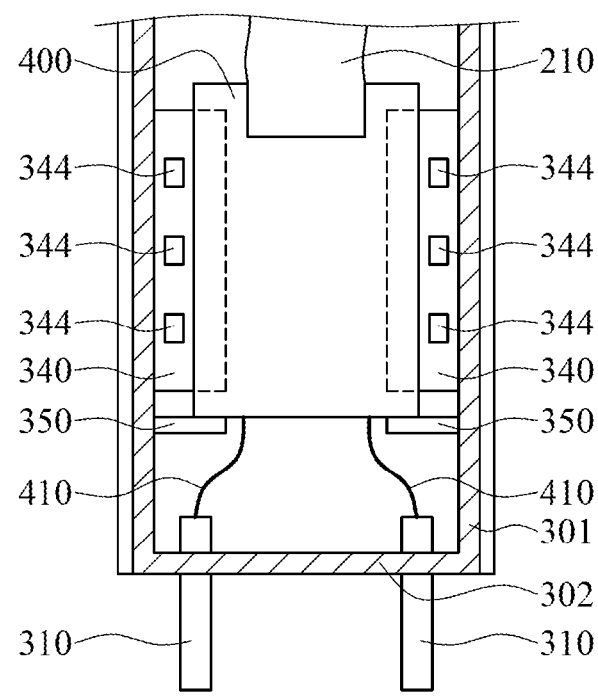

Referring to FIG. 31, the difference between the end caps 300 of FIG. 31 and FIG. 29 is that the horizontal rib 340 shown in FIG. 29 is a whole piece and instead, the horizontal rib 340 shown in FIG. 31 comprises one or more through holes. More particularly, each of the horizontal ribs 340 shown in FIG. 31 comprises a plurality of ventilating holes 344. The ventilating hole 344 penetrates through the horizontal rib 340 and the ventilating holes 344 are arranged on the horizontal rib 340. The ventilating holes 344 can be utilized for convection of air and is beneficial to improve the effect of heat dissipation.

Figure 32:
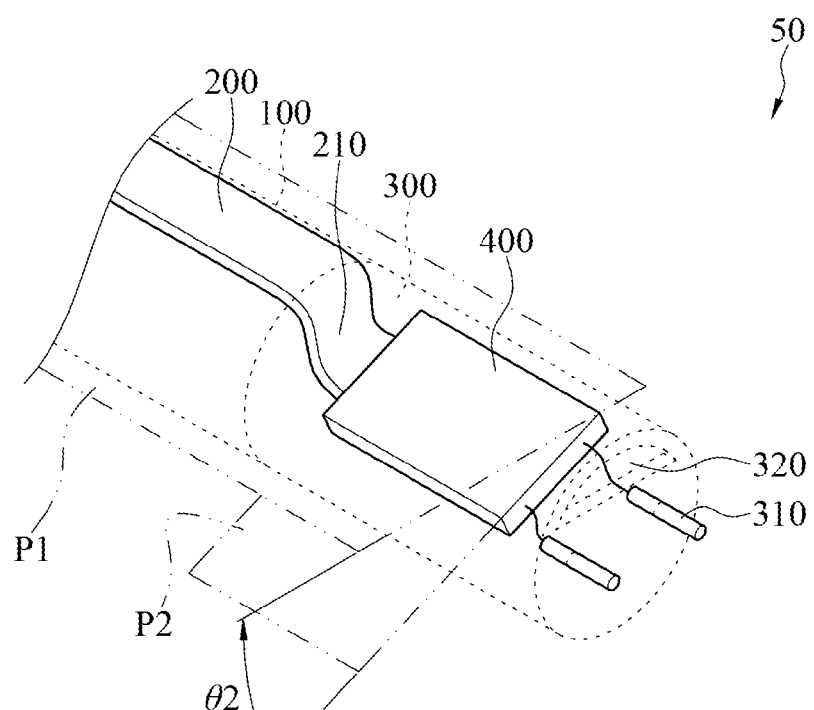
FIG. 32 illustrates a partial view of an LED tube lamp according to an embodiment of the instant disclosure, and some components thereof are transparent.

Referring to FIG. 32, the difference between the LED tube lamps 50 of FIG. 32 and FIGS. 1 to 4 is with respect to the relationship of the LED light strip 200 and the printed circuit board 420 of the power supply 400. A plane at which the LED light strip 200 shown in FIGS. 1 to 4 locates is substantially parallel with a plane at which the printed circuit board 420 of the power supply 400 locates. However, a plane at which the LED light strip 200 shown in FIG. 32 locates is not parallel with a plane at which the printed circuit board 420 of the power supply 400 locates. More particularly, as shown in FIG. 32, the LED light strip 200 locates at a first plane P1, and the printed circuit board 420 of the power supply 400 locates at a second plane P2. The first plane P1 and the second plane P2 are substantially parallel with the axial direction of the tube 100, and the first plane P1 and the second plane P2 define an angle $\theta 2$ about the axial direction of the tube 100. The angle $\theta 2$ is greater than 0 degree and is less than 90 degrees. In other words, comparing to the printed circuit board 420 of the power supply 400 and the LED light strip 200 shown in FIGS. 1 to 4, the printed circuit board 420 of the power supply 400 shown in FIG. 32 relative to the LED light strip 200 rotates about the axial direction of the tube 100 to the angle θ2. Based on the configuration that the plane at which the LED light strip 200 locates and the plane at which the printed circuit board 420 of the power supply 400 locates are not parallel with each other and instead intersect on a plane of projection along the axial direction of the tube 100, the heated air heated by the LED light strip 200 and the LED light sources 202 can easily flow through the tube 100 to the end cap 300 so as to further flow through the opening 320 to outside area of the end cap 300, which is beneficial to improve the effect of heat dissipation.

Figure 33:
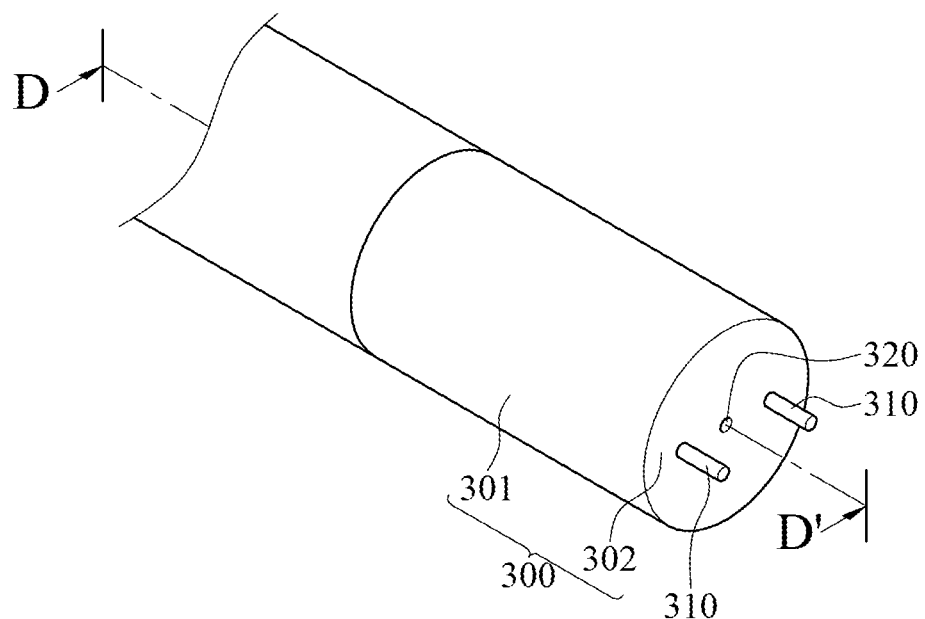
FIG. 33 illustrates a partial view of an LED tube lamp according to an embodiment of the instant disclosure.

Referring to FIG. 33, the difference between the end caps 300 of FIG. 33 and FIGS. 1 to 4 is the forms of the openings 320. The opening 320 shown in FIG. 33 is, but is not limited to, at the center of the end wall 302. In the assembling process of the LED tube lamp 50, two end caps 300 have to be assembled to two ends of the tube 100. After one of the two end caps 300 is assembled to one end of the tube 100, it is more difficult to have the other end caps 300 assembled to the other end of the tube 100. The reason is that if the inner space of the tube 100 and end caps 300 is sealed or is almost sealed, the pressure inside the tube 100 and end caps 300 increases along with compression of gas inside the tube 100 and end caps 300. More strength is required to assemble the end cap 300 to the tube 100 to against the increased pressure inside the tube 100 and end caps 300, which leads to difficulty of assembling. The opening 320 shown in FIG. 33 can function as a pressure-releasing tunnel. Under the circumstances, gas inside the tube 100 and end caps 300 can be released through the opening 320 during the process of assembling the last one of the two end caps 300 to the tube 100, such that the pressure inside the tube 100 and end caps 300 can be constant. It is beneficial to the assembling process of the LED tube lamp 50 and to improve the efficiency of assembling. On the other hand, if there is no opening on the end caps 300, the pressure inside the tube 100 and the end caps 300 of the LED tube lamp 50 may become negative pressure resulting from the lowering of the temperature inside the tube 100 and the end caps 300. The opening 320 functioning as the pressure-releasing tunnel also allows the outside gas capable of flowing into the tube 100 and the end caps 300 such that the pressure inside the tube 100 and the end caps 300 can remain constant (equal to the pressure outside the tube 100 and the end caps 300); therefore, during a disassembling process of the LED tube lamp 50, the end cap 300 is easily to be disassembled from the tube 100.

In addition, when the LED tube lamp 50 operates, the electronic components of the LED tube lamp 50 keep generating heat such that the temperature inside the LED tube lamp 50 increases. According to the equation of state of a hypothetical ideal gas, the result of multiplication of pressure and volume of gas inside the LED tube lamp 50 increases along with the increase of the temperature. If gas is sealed in the tube 100 and the end caps 300, the volume of the gas is constant. Thus the pressure increases along with the increase of the temperature. Under the circumstances, when the LED tube lamp 50 continuously operates, the electronic components continuously suffer high temperature and high pressure and, consequently, are easily damaged. The opening 320 shown in FIG. 33 can function as a pressure-releasing tunnel. In other words, the expanding gas can be released from the opening 320 when the temperature of the gas inside the LED tube lamp 50 increases, which is beneficial to decrease the pressure inside the LED tube lamp 50.

Figure 34:
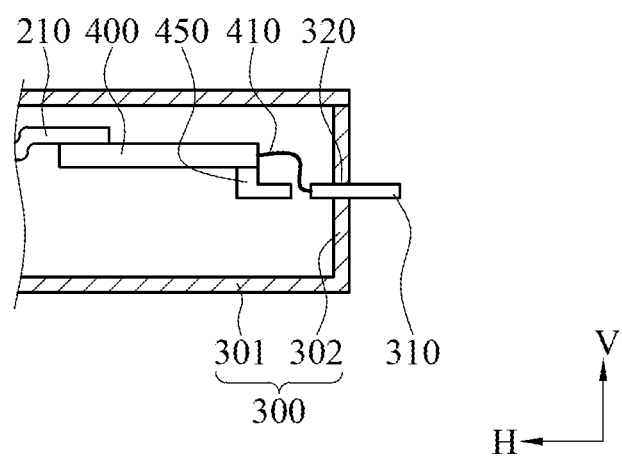
FIG. 34 illustrates a part of a cross section of FIG. 33 along the line D-D', and a light sensor is added.
Figure 35:
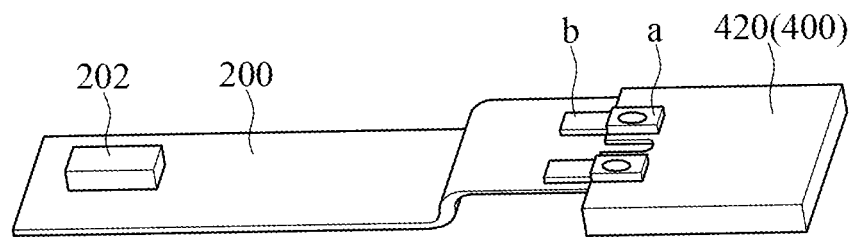
FIG. 35 illustrates a partial view of a LED light strip and a power supply soldered to each other according to an embodiment of the instant disclosure.

Referring to FIG. 34, FIG. 34 is a part of a cross section of FIG. 33 along the line D-D'. The difference between FIG. 34 and FIG. 33 is that the LED tube lamp 50 shown in FIG. 34 further comprises a light sensor 450 and a circuit safety switch (not shown). In the embodiment, the light sensor 450 and the circuit safety switch are, but are not limited to, disposed on the printed circuit board 420 of the power supply 400 and are electrically connected to the printed circuit board 420 of the power supply 400. Moreover, the power supply 400 can comprise a built-in electricity source. For example, the power supply 400 can comprise a mini battery; therefore, the power supply 400 can be supplied by the mini battery so as to supply the operation of the light sensor 450 and the circuit safety switch before the LED tube lamp 50 is installed to a lamp base. The circuit safety switch is integrated in the power supply 400. The light sensor 450 is positioned corresponding to the opening 320, and the light sensor 450 is collimated with the opening 320. In different embodiments, the light sensor 450 does not extend into the opening 320. Alternatively, the light sensor 450 can extend into the opening 320. The light sensor 450 can sense light inside the opening 320 or ambient light outside the opening 320 but near the end wall 302. Furthermore, the light sensor 450 can generate sensing signals according to the intensity of the sensed light (e.g., brightness). The sensing signals are transmitted to the circuit safety switch. The circuit safety switch determines whether to close or to open the circuit of the power supply 400 based on the received sensing signals.

How the light sensor 450 and the circuit safety switch work are described below and the description is merely an example but not a limitation. When the brightness sensed by either one of the light sensors 450 of the end caps 300 is greater than a predetermined threshold, the circuit safety switch opens the circuit of the power supply 400. When the brightness sensed by both of the light sensors 450 of the end caps 300 are less than the predetermined threshold, the circuit safety switch closes the circuit of the power supply 400.

For instance, when a user holds the LED tube lamp 50 and is going to install the LED tube lamp 50 to the lamp base 60 (referring to FIGS. 19 to 21), the end caps 300 at two ends of the LED tube lamp 50 are exposed to the environment and do not obstructed by anything such that the brightness sensed by both of the light sensors 450 of the end caps 300 are greater than the predetermined threshold, the circuit safety switch opens the circuit of the power supply 400. Next, when the user has the hollow conductive pins 310 of the end cap 300 of one end of the LED tube lamp 50 plugged into the conductive sockets 61 of one end of the lamp base 60, the light sensor 450 in the end cap 300 having been plugged into one end of the lamp base 60 is obstructed by the lamp base 60, and, consequently, brightness sensed by the light sensor 450 is less than the predetermined threshold. However, brightness sensed by the light sensor 450 in the other end cap 300 which is not yet plugged into the conductive sockets 61 is still greater than the predetermined threshold. In the situation, the circuit safety switch still has the circuit of the power supply 400 remain open. Thus there is no risk of electric shock to the user. Finally, when the user properly install the LED tube lamp 50 to the lamp base 60, both of the end caps 300 at two ends of the LED tube lamp 50 are obstructed by the lamp base 60, and brightness sensed by both of the light sensors 450 of the two end caps 300 are less than the predetermined threshold. Under the circumstances that brightness sensed by both of the light sensors 450 of the two end caps 300 are less than the predetermined threshold, the circuit safety switch closes the circuit of the power supply 400, and the power supply 400 of which the circuit is closed can received electricity from the lamp base 60 and can supply the LED light strip 200 and the LED light source 202.

According to the light sensors 450 and the circuit safety switches of the LED tube lamp 50 shown in FIG. 34, under the circumstances that the hollow conductive pins 310 of the end cap 300 of one end of the LED tube lamp 50 is plugged into the conductive sockets 61 of one end of the lamp base 60 and the hollow conductive pins 310 of the end cap 300 of the other end of the LED tube lamp 50 is still exposed to environment, the circuit safety switches automatically open the circuits of the power supply 400 (or have the circuits of the power supply 400 remain open). Thus the user has no risk of electric shock even if the exposed hollow conductive pins 310 are contacted by the user. As a result, safety regarding the use of the LED tube lamp 50 can be ensured.

Figure 36:
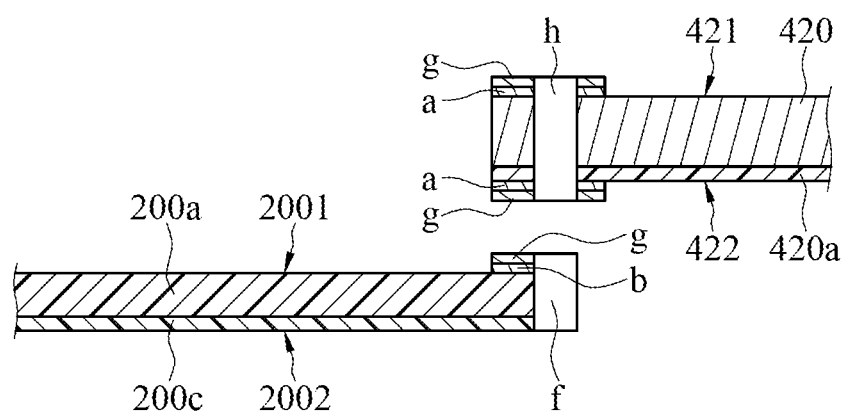
FIGS. 36 to 38 illustrate diagrams of a soldering process of the LED light strip and the power supply according to an embodiment of the instant disclosure.
Figure 37:
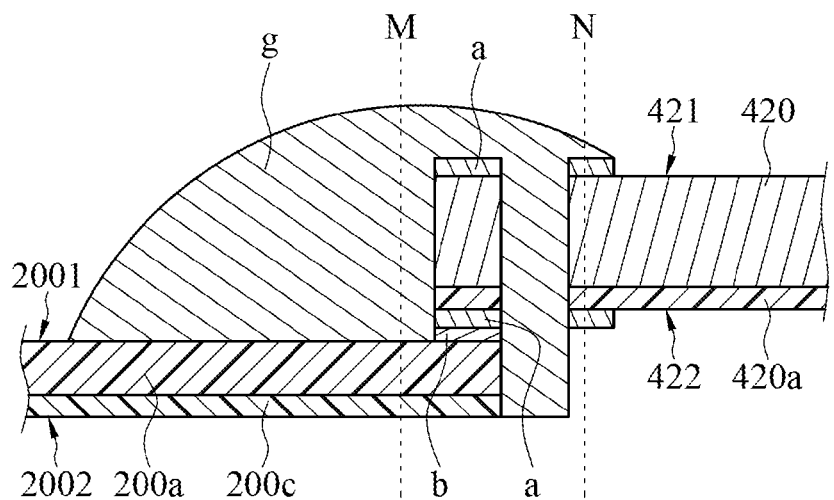
Figure 38:
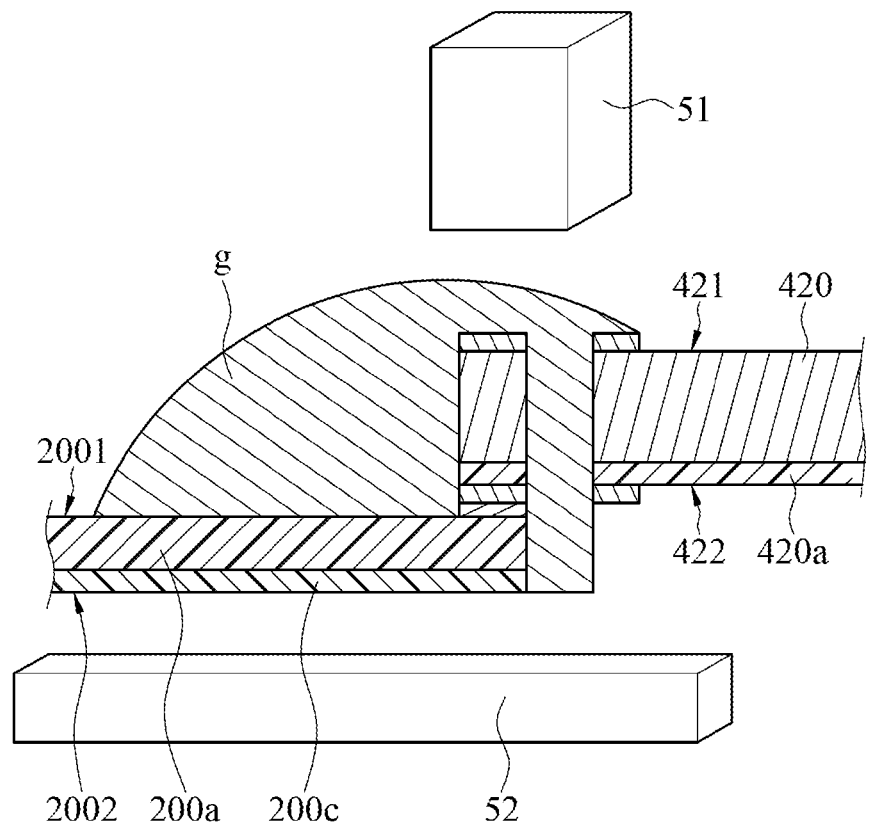

Referring to FIG. 35 to FIG. 38, FIG. 35 is a perspective view of a LED light strip 200, e.g., a bendable circuit sheet, and a printed circuit board 420 of a power supply 400 soldered to each other and FIG. 36 to FIG. 38 are diagrams of a soldering process of the LED light strip 200 and the printed circuit board 420 of the power supply 400. In the embodiment, the LED light strip 200 and the freely extending end portions 210 have the same structure. The freely extending end portions 210 are the portions of two opposite ends of the LED light strip 200 and are utilized for being connected to the printed circuit board 420. The LED light strip 200 and the power supply 400 are electrically connected to each other by soldering. Two opposite ends of the LED light strip 200 are utilized for being respectively soldered to the printed circuit board 420 of the power supply 400. In other embodiments, only one end of the LED light strip 200 is soldered to the power supply 400. The LED light strip 200 is, but not limited to, a bendable circuit sheet, and the LED light strip 200 comprises a circuit layer 200a and a circuit protecting layer 200c over a side of the circuit layer 200a.

In one embodiment, the LED light strip 200 includes a bendable circuit sheet having a conductive wiring layer and a dielectric layer that are arranged in a stacked manner, wherein the wiring layer and the dielectric layer have same areas (not shown) or the wiring layer has less area than the dielectric layer. The LED light source 202 is disposed on one surface of the wiring layer, the dielectric layer is disposed on the other surface of the wiring layer that is away from the LED light sources 202. The wiring layer is electrically connected to the power supply 400 to carry direct current (DC) signals. Meanwhile, the surface of the dielectric layer away from the wiring layer is fixed to the inner circumferential surface of the tube 100 by means of a adhesive sheet (not shown). The wiring layer can be a metal layer or a power supply layer including wires such as copper wires.

In another embodiment, the outer surface of the wiring layer or the dielectric layer may be covered with a circuit protective layer made of an ink with function of resisting soldering and increasing reflectivity (not shown). Alternatively, the dielectric layer can be omitted and the wiring layer can be directly bonded to the inner circumferential surface of the tube 100, and the outer surface of the wiring layer is coated with the circuit protective layer. Whether the wiring layer has a one-layered, or two-layered structure, the circuit protective layer can be adopted. In some embodiments, the circuit protective layer is disposed only on one side/surface of the LED light strip 200, such as the surface having the LED light source 202. In some embodiments, the bendable circuit sheet is a one-layered structure made of just one wiring layer, or a two-layered structure made of one wiring layer and one dielectric layer, and thus is more bendable or flexible to curl when compared with the conventional three-layered flexible substrate (one dielectric layer sandwiched with two wiring layers). As a result, the bendable circuit sheet of the LED light strip 200 can be installed in a tube with a customized shape or non-tubular shape, and fitly mounted to the inner surface of the tube 100. The bendable circuit sheet closely mounted to the inner surface of the tube 100 is preferable in some cases. In addition, using fewer layers of the bendable circuit sheet improves the heat dissipation and lowers the material cost.

Nevertheless, the bendable circuit sheet is not limited to being one-layered or two-layered; in other embodiments, the bendable circuit sheet may include multiple layers of the wiring layers and multiple layers of the dielectric layers, in which the dielectric layers and the wiring layers are sequentially stacked in a staggered manner, respectively (not shown). These stacked layers are away from the surface of the outermost wiring layer which has the LED light source 202 disposed thereon and is electrically connected to the power supply 400. Moreover, the length of the bendable circuit sheet is greater than the length of the tube 100.

In one embodiment, the LED light strip 200 includes a bendable circuit sheet having in sequence a first wiring layer, a dielectric layer, and a second wiring layer. The thickness of the second wiring layer is greater than that of the first wiring layer, and the length of the LED light strip 200 is greater than that of the tube 100. The end region of the light strip 200 extending beyond the end portion of the tube 100 without disposition of the light source 202 is formed with two separate through holes to respectively electrically communicate the first wiring layer and the second wiring layer. The two separate through holes are not communicated to each other to avoid short.

In this way, the greater thickness of the second wiring layer allows the second wiring layer to support the first wiring layer and the dielectric layer, and meanwhile allow the LED light strip 200 to be mounted onto the inner circumferential surface without being liable to shift or deform, and thus the yield rate of product can be improved. In addition, the first wiring layer and the second wiring layer are in electrical communication such that the circuit layout of the first wiring later can be extended downward to the second wiring layer to reach the circuit layout of the entire LED light strip 200. Moreover, since the land for the circuit layout becomes two-layered, the area of each single layer and therefore the width of the LED light strip 200 can be reduced such that more LED light strips 200 can be put on a production line to increase productivity. Furthermore, the first wiring layer and the second wiring layer of the end region of the LED light strip 200 that extends beyond the end portion of the tube 100 without disposition of the light source 202 can be used to accomplish the circuit layout of a power supply 400 so that the power supply 400 can be directly disposed on the bendable circuit sheet of the LED light strip 200.

Moreover, the LED light strip 200 comprises two opposite surfaces which are a first surface 2001 and a second surface 2002. The first surface 2001 is the one on the circuit layer 200a and away from the circuit protecting layer 200c. The second surface 2002 is the other one on the circuit protecting layer 200c and away from the circuit layer 200a. Several LED light sources 202 are disposed on the first surface 2001 and are electrically connected to circuits of the circuit layer 200a. The circuit protecting layer 200c has less electrical and thermal conductivity but being beneficial to protect the circuits. The first surface 2001 of the LED light strip 200 comprises soldering pads "b". Soldering material "g" can be placed on the soldering pads "b". In the embodiment, the LED light strip 200 further comprises a notch "f". The notch "f" is disposed on an edge of the end of the LED light strip 200 soldered to the printed circuit board 420 of the power supply 400. The printed circuit board 420 comprises a power circuit layer 420a and soldering pads "a". Moreover, the printed circuit board 420 comprises two opposite surfaces which are a first surface 421 and a second surface 422. The second surface 422 is the one on the power circuit layer 420a. The soldering pads "a" are respectively disposed on the first surface 421 and the second surface 422. The soldering pads "a" on the first surface 421 are corresponding to those on the second surface 422. Soldering material "g" can be placed on the soldering pad "a". In the embodiment, considering the stability of soldering and the optimization of automatic process, the LED light strip 200 is disposed below the printed circuit board 420 (the direction is referred to FIG. 36). That is to say, the first surface 2001 of the LED light strip 200 is connected to the second surface 422 of the printed circuit board 420.

As shown in FIG. 37 and FIG. 38, in the soldering process of the LED light strip 200 and the printed circuit board 420, the circuit protecting layer 200c of the LED light strip 200 is placed on a supporting table 52 (i.e., the second surface 2002 of the LED light strip 200 contacts the supporting table 52) in advance. The soldering pads "a" on the second surface 422 of the printed circuit board 420 directly sufficiently contact the soldering pads "b" on the first surface 2001 of the LED light strip 200. And then a thermo-compression heating head 51 presses on a portion where the LED light strip 200 and the printed circuit board 420 are soldered to each other. When soldering, the soldering pads "b" on the first surface 2001 of the LED light strip 200 contact the soldering pads "a" on the second surface 422 of the printed circuit board 420, and the soldering pads "a" on the first surface 421 of the printed circuit board 420 contact the thermo-compression heating head 51. Under the circumstances, the heat from the thermo-compression heating head 51 can directly transmit through the soldering pads "a" on the first surface 421 of the printed circuit board 420 and the soldering pads "a" on the second surface 422 of the printed circuit board 420 to the soldering pads "b" on the first surface 2001 of the LED light strip 200. The transmission of the heat between the thermo-compression heating head 51 and the soldering pads "a" and "b" is not likely to be affected by the circuit protecting layer 200c which has relatively less thermal conductivity, and, consequently, the efficiency and stability regarding the connections and soldering process of the soldering pads "a" and "b" of the printed circuit board 420 and the LED light strip 200 can be improved. As shown in FIG. 37, the printed circuit board 420 and the LED light strip 200 are firmly connected to each other by the soldering material "g". Components between the virtual line M and the virtual line N of FIG. 37 from top to bottom are the soldering pads "a" on the first surface 421 of the printed circuit board 420, the printed circuit board 420, the power circuit layer 420a, the soldering pads "a" on the second surface 422 of the printed circuit board 420, the soldering pads "b" on the first surface 2001 of LED light strip 200, the circuit layer 200a of the LED light strip 200, and the circuit protecting layer 200c of the LED light strip 200. The connection of the printed circuit board 420 and the LED light strip 200 are firm and stable.

In other embodiments, an additional circuit protecting layer can be disposed over the first surface 2001 of the circuit layer 200a. In other words, the circuit layer 200a is sandwiched between two circuit protecting layers 200c, and therefore the first surface 2001 of the circuit layer 200a can be protected by the circuit protecting layer 200c. A part of the circuit layer 200a (the part having the soldering pads "b") is exposed for being connected to the soldering pads "a" of the printed circuit board 420. Under the circumstances, a part of the bottom of the LED light source 202 contacts the circuit protecting layer 200c on the first surface 2001 of the circuit layer 200a, and the other part of the bottom of the LED light source 202 contacts the circuit layer 200a.

In addition, according to the embodiment shown in FIG. 35 to FIG. 38, the printed circuit board 420 further comprises through holes "h" passing through the soldering pads "a". In an automatic soldering process, when the thermo-compression heating head 51 automatically presses the printed circuit board 420, the soldering material "g" on the soldering pads "a" can be pushed into the through holes "h" by the thermo-compression heating head 51 accordingly, which fits the needs of automatic process.

Power supply may be otherwise referred to as a power conversion module/circuit or power module, and encompass the conventional meanings of the term "power supply" commonly understood by one of ordinary skill in the art, including a meaning of "a circuit that converts ac line voltage to dc voltage and supplies power to the LED or LED module". They are called a "power supply" herein as they are for supplying or providing power, from external signal(s) as from AC powerline or a ballast, to the LED module. And these different terms of a "power conversion module/circuit" and a "power module" may be used herein or in future continuing applications to mean/denote the power supply.

If any terms in this application conflict with terms used in any application(s) from which this application claims priority, or terms incorporated by reference into this application or the application(s) from which this application claims priority, a construction based on the terms as used or defined in this application should be applied.

While the instant disclosure related to an LED tube lamp has been described by way of example and in terms of the preferred embodiments, it is to be understood that the instant disclosure needs not be limited to the disclosed embodiments. For anyone skilled in the art, various modifications and improvements within the spirit of the instant disclosure are covered under the scope of the instant disclosure. The covered scope of the instant disclosure is based on the appended claims.

What is claimed is:
1. An LED tube lamp, comprising:
a tube;
two end caps respectively at two opposite ends of the tube;
a power supply in one or both of the end caps; and
an LED light strip in the tube, the LED light strip being provided with a plurality of LED light sources disposed thereon, the LED light sources being electrically connected to the power supply via the LED light strip;
wherein the end cap comprises:
a lateral wall substantially coaxial with the tube and connected to a rear end region;
an end wall substantially perpendicular to an axial direction of the lateral wall and connected to an end of the lateral wall away from the tube; and
at least one opening penetrating through the end cap, wherein the at least one opening penetrates through the end wall, an axial direction of the at least one opening is substantially parallel with the axial direction of the lateral wall, and a part of an inner surface of the at least one opening is substantially aligned with a part of an inner surface of the lateral wall.

2. The LED tube lamp of claim 1, wherein the at least one opening penetrates through the end cap with a light sensor inside the end cap collimating with the opening.

3. The LED tube lamp of claim 1, wherein an axial direction of the at least one opening and the axial direction of the lateral wall define an acute angle.

4. The LED tube lamp of claim 1, wherein a radial area of the at least one opening is less than 1/10 of a radial area of the end wall.

5. The LED tube lamp of claim 1, wherein a radial area of the at least one opening is 0.5 mm² to 3 mm².

6. The LED tube lamp of claim 1, wherein the end cap further comprises a dust-proof net, and the dust-proof net covers the at least one opening.

7. The LED tube lamp of claim 1, wherein the end cap further comprises a plurality of openings asymmetrically arranged on the end wall.

8. The LED tube lamp of claim 1, wherein an end wall radius is defined between the center and the periphery of the end wall, and a distance between the at least one opening and the center of the end wall is from 2/5 to 4/5 of the end wall radius.

9. The LED tube lamp of claim 1, wherein the power supply is divided into two parts respectively in the two end caps.

10. The LED tube lamp of claim 1, wherein the tube comprises two rear end regions, two transition regions and a main body region, the two rear end regions are at two opposite ends of the main body region, the two transition regions are respectively between the two rear end regions and the main body region, and the two end caps are respectively connected to the two rear end regions, wherein in the transition region, the tube narrows, or tapers in a continuous, smooth manner to have a smaller diameter when moving along the length of the tube from the main body region to the rear end region.

11. The LED tube lamp of claim 10, wherein the transition region is formed by two curves at both ends, and one curve is toward inside of the tube and the other curve is toward outside of the tube.

12. The LED tube lamp of claim 1, wherein the LED light strip comprises a bendable circuit sheet.

13. The LED tube lamp of claim 1, wherein the at least one opening is arc-shaped.

14. The LED tube lamp of claim 1, wherein the tube and the end cap are secured by a hot melt adhesive.

15. An LED tube lamp, comprising:
a tube;
two end caps respectively at two opposite ends of the tube;
a power supply in one or both of the end caps; and
an LED light strip in the tube, the LED light strip being provided with a plurality of LED light sources disposed thereon, the LED light sources being electrically connected to the power supply via the LED light strip;
wherein the end cap comprises:
a lateral wall substantially coaxial with the tube and connected to the tube;
an end wall substantially perpendicular to an axial direction of the lateral wall and connected to an end of the lateral wall away from the tube; and
at least one opening penetrating through the end wall,
wherein the power supply comprises a printed circuit board and electronic components, the printed circuit board comprises a first surface and a second surface opposite to and substantially parallel with each other, the first surface and the second surface of the printed circuit board are substantially perpendicular to the axial direction of the lateral wall, the second surface of the printed circuit board is closer to the end wall of the end cap, the electronic components comprises a driving module and a general electronic component, the driving module generates more heat than the general electronic component does, the driving module of the power supply is on the second surface of the printed circuit board and is closer to the at least one opening than the general electronic component is.

16. The LED tube lamp of claim 15, wherein the second surface of the printed circuit board fully contacts an inner surface of the end wall.

17. The LED tube lamp of claim 16, wherein the end cap comprises at least one opening, the at least one opening penetrates through the end wall, and the second surface of the printed circuit board covers the at least one opening.

18. The LED tube lamp of claim 17, wherein the power supply further comprises a heat-dissipating element on the second surface of the printed circuit board and extends to inside area of the at least one opening.

19. The LED tube lamp of claim 18, wherein the heat-dissipating element and the at least one opening are substantially sealed in the radial direction of the at least one opening.

20. The LED tube lamp of claim 18, wherein there is a gap between the heat-dissipating element and the at least one opening in the radial direction of the at least one opening.

21. The LED tube lamp of claim 17, wherein the driving module comprises an inductor, a transistor, a resistor, or an integrated circuit on the second surface of the printed circuit board and locating adjacently to the at least one opening.

22. The LED tube lamp of claim 21, wherein at least one component of the driving module and the at least one opening are substantially sealed in the radial direction of the at least one opening.

23. The LED tube lamp of claim 21, wherein there is a gap between the driving module and the at least one opening in the radial direction of the at least one opening.

24. The LED tube lamp of claim 15, wherein the at least one opening penetrates through the end cap with a light sensor on the second surface of the printed circuit board inside the end cap collimating with the opening.

25. The LED tube lamp of claim 15, wherein the tube comprises two rear end regions, two transition regions and a main body region, the two rear end regions are at two opposite ends of the main body region, the two transition regions are respectively between the two rear end regions and the main body region, and the two end caps are respectively connected to the two rear end regions, wherein in the transition region, the tube narrows, or tapers in a continuous, smooth manner to have a smaller diameter when moving along the length of the tube from the main body region to the rear end region.

26. An LED tube lamp, comprising:
a tube;
two end caps respectively at two opposite ends of the tube;
a power supply in one or both of the end caps; and
an LED light strip in the tube, the LED light strip being provided with a plurality of LED light sources disposed thereon, the LED light sources being electrically connected to the power supply via the LED light strip;
wherein the end cap comprises:
a lateral wall substantially coaxial with the tube and connected to the tube;
an end wall substantially perpendicular to an axial direction of the lateral wall and connected to an end of the lateral wall away from the tube; and
at least one opening penetrating through the end wall,
wherein the power supply comprises a printed circuit board, electronic components, and a heat-dissipating element; the printed circuit board comprises a first surface and a second surface opposite to and substantially parallel with each other; the first surface and the second surface of the printed circuit board are substantially parallel with the axial direction of the lateral wall, the electronic components and the heat-dissipating element are on the first surface of the printed circuit board, and the heat-dissipating element is closer to the at least one opening of the end cap than the electronic components are.

27. The LED tube lamp of claim 1, wherein the substantial alignment of the part of the inner surface of the at least one opening with the part of the inner surface of the lateral wall is a substantially tangential alignment.

28. The LED tube lamp of claim 27, further comprising a base configured to receive the tube, wherein the axial direction of the at least one opening is formed at an acute angle with respect to an edge of the base in a horizontal direction while the tube is received by the base.

29. An LED tube lamp, comprising:
a tube;
two end caps respectively at two opposite ends of the tube;
a power supply in one or both of the end caps; and
an LED light strip in the tube, the LED light strip being provided with a plurality of LED light sources disposed thereon, the LED light sources being electrically connected to the power supply via the LED light strip;
wherein the end cap comprises:
a lateral wall substantially coaxial with the tube and connected to the tube;
an end wall substantially perpendicular to an axial direction of the lateral wall and connected to an end of the lateral wall away from the tube; and
at least one opening penetrating through the end wall,
wherein the power supply comprises a printed circuit board and electronic components;
the printed circuit board comprises a first surface and a second surface opposite to and substantially parallel with each other; the first surface and the second surface of the printed circuit board are substantially parallel with the axial direction of the lateral wall, the electronic components are on the first surface, the electronic components comprises a driving module and a general electronic component, and the driving module generates more heat than the general electronic component does, and wherein the driving module is on one of two opposite sides of the first surface close to the at least one opening, and the general electronic components are on another one of the two opposite sides of the first surface remote from the at least one opening.

30. The LED tube lamp of claim 29, wherein the driving module comprises an inductor, a transistor, a resistor, or an integrated circuit on the first surface of the printed circuit board and locating adjacently to the at least one opening.

* * * * *